United States Patent
Nakamizo

(10) Patent No.: US 10,559,619 B2
(45) Date of Patent: Feb. 11, 2020

(54) IMAGING DEVICE AND METHOD OF MANUFACTURING IMAGING DEVICE

(71) Applicant: Sony Corporation, Tokyo (JP)

(72) Inventor: Masahiko Nakamizo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/739,230

(22) PCT Filed: Jan. 11, 2017

(86) PCT No.: PCT/JP2017/000533
§ 371 (c)(1),
(2) Date: Dec. 22, 2017

(87) PCT Pub. No.: WO2017/145537
PCT Pub. Date: Aug. 31, 2017

(65) Prior Publication Data
US 2018/0190703 A1    Jul. 5, 2018

(30) Foreign Application Priority Data
Feb. 22, 2016 (JP) ................................. 2016-031074

(51) Int. Cl.
*H04N 5/369* (2011.01)
*H01L 27/146* (2006.01)
(Continued)

(52) U.S. Cl.
CPC .... *H01L 27/14634* (2013.01); *H01L 27/1461* (2013.01); *H01L 27/1463* (2013.01);
(Continued)

(58) Field of Classification Search
CPC ......... H01L 27/14634; H01L 27/14656; H01L 27/14689; H01L 27/1464; H01L 27/14605;
(Continued)

(56) References Cited

U.S. PATENT DOCUMENTS 6,788,237 B1    9/2004 Bidermann et al.
8,513,710 B2    8/2013 Mabuchi
(Continued)

FOREIGN PATENT DOCUMENTS

EP    1 473 553 A1    11/2004
JP    2003-232679 A    8/2003
(Continued)

OTHER PUBLICATIONS

International Search Report and English translation thereof dated Feb. 28, 2017 in connection with International Application No. PCT/JP2017/000533.
(Continued)

*Primary Examiner* — Twyler L Haskins
*Assistant Examiner* — Angel L Garces-Rivera
(74) *Attorney, Agent, or Firm* — Wolf, Greenfield & Sacks, P.C.

(57) ABSTRACT

To reduce the influence of noise in the imaging device configured with the plurality of semiconductor chips.
A first semiconductor chip includes a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line. A second semiconductor chip includes a processing circuit which processes the result of the comparison, a second signal line which is electrically connected to the
(Continued)

processing circuit and delivers the result of the comparison to the processing circuit, and a second pad which is electrically connected to the second signal line and the first pad.

17 Claims, 20 Drawing Sheets

(51) Int. Cl.
| | | |
|---|---|---|
| *H04N 5/374* | (2011.01) | |
| *H04N 5/378* | (2011.01) | |
| *H04N 5/357* | (2011.01) | |
| *H01L 21/265* | (2006.01) | |
| *H01L 23/00* | (2006.01) | |

(52) U.S. Cl.
CPC ...... *H01L 27/1464* (2013.01); *H01L 27/1469* (2013.01); *H01L 27/14605* (2013.01); *H01L 27/14612* (2013.01); *H01L 27/14636* (2013.01); *H01L 27/14656* (2013.01); *H01L 27/14689* (2013.01); *H04N 5/357* (2013.01); *H04N 5/3698* (2013.01); *H04N 5/374* (2013.01); *H04N 5/378* (2013.01); *H01L 21/26586* (2013.01); *H01L 24/08* (2013.01); *H01L 24/80* (2013.01); *H01L 2224/0557* (2013.01); *H01L 2224/08146* (2013.01); *H01L 2224/80203* (2013.01)

(58) Field of Classification Search
CPC ........... H01L 27/14612; H01L 27/1461; H01L 27/1469; H01L 27/14636; H01L 27/1463; H01L 27/146; H01L 21/26586; H01L 2224/80203; H01L 2224/08146; H01L 2224/0557; H01L 24/08; H01L 24/80; H04N 5/3698; H04N 5/378; H04N 5/374; H04N 5/369; H04N 5/357
See application file for complete search history.

(56) References Cited

U.S. PATENT DOCUMENTS

| | | | |
|---|---|---|---|
| 8,957,358 | B2 | 2/2015 | Wan et al. |
| 9,136,302 | B2 | 9/2015 | Wang et al. |
| 10,021,331 | B2 | 7/2018 | Sakakibara et al. |
| 2006/0023109 | A1 | 2/2006 | Mabuchi et al. |
| 2006/0165294 | A1 | 7/2006 | Mizuno et al. |
| 2013/0100326 | A1 | 4/2013 | Ueno |
| 2013/0285180 | A1 | 10/2013 | Wang et al. |
| 2014/0347538 | A1 | 11/2014 | Toda |
| 2017/0033144 | A1 | 2/2017 | Takahashi |
| 2017/0272678 | A1* | 9/2017 | Sakakibara .......... H04N 5/3745 |
| 2018/0176490 | A1 | 6/2018 | Nakamizo |
| 2018/0241960 | A1 | 8/2018 | Sakakibara et al. |

FOREIGN PATENT DOCUMENTS

| | | |
|---|---|---|
| JP | 2013-090305 A | 5/2013 |
| JP | 2013-110566 A | 6/2013 |
| JP | 2013-179313 A | 9/2013 |
| JP | 2013-232647 A | 11/2013 |
| WO | WO 2015/159766 | 10/2015 |
| WO | WO 2016/009832 A1 | 1/2016 |

OTHER PUBLICATIONS

Written Opinion and English translation thereof dated Feb. 28, 2017 in connection with International Application No. PCT/JP2017/000533.

International Preliminary Report on Patentability and English translation thereof dated Sep. 7, 2018 in connection with International Application No. PCT/JP2017/000533.

Extended European Search Report dated Aug. 13, 2019 in connection with European Application No. 17755979.6.

* cited by examiner a b c a b

IMAGING DEVICE AND METHOD OF MANUFACTURING IMAGING DEVICE

CROSS-REFERENCE TO RELATED APPLICATIONS

This application claims the benefit under 35 U.S.C. § 371 as a U.S. National Stage Entry of International Application No. PCT/JP2017/000533, filed in the Japanese Patent Office as a Receiving Office on Jan. 11, 2017, which claims priority to Japanese Patent Application Number JP2016-031074, filed in the Japanese Patent Office on Feb. 22, 2016, each of which is hereby incorporated by reference in its entirety.

TECHNICAL FIELD

The present technology relates to an imaging device and a method of manufacturing the imaging device, and particularly, to an imaging device configured with a plurality of semiconductor chips and a method of manufacturing the imaging device.

BACKGROUND ART

In the related art, to miniaturize imaging devices and improve aperture ratios of pixels, imaging devices configured by stacking semiconductor chips in which pixels are disposed and semiconductor chips on which peripheral circuits are mounted are used. For example, an imaging device configured by stacking a first semiconductor chip on which pixels are disposed in a 2-dimensional lattice shape and which outputs an analog image signal and a second semiconductor chip which processes the output analog image signal has been proposed (for example, see Patent Literature 1). In the technology of the related art, analog digital converters are disposed in a 2-dimensional lattice shape on the second semiconductor chip and an analog image signal output from the first semiconductor chip is directly input to the analog digital converters of the second semiconductor chip.

CITATION LIST

Patent Literature

Patent Literature 1: JP 2013-179313A

DISCLOSURE OF INVENTION

Technical Problem

In the above-described technology of the related art, since the pixels and the analog digital converters are disposed on the different semiconductor chips, there is a problem that wirings from output terminals of the pixels to input terminals of the analog digital converters are lengthened. Since an analog image signal with a relatively low signal level is delivered via the wiring, there is a problem that it is easy to receive an influence of noise in the above-described technology of the related art.

The present technology was finalized in view of this situation and is capable of reducing an influence of noise in an imaging device configured with a plurality of semiconductor chips.

Solution to Problem

The present technology has been made to solve the above problem. According to a first aspect of the present technology, an imaging device includes: a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line; and a second semiconductor chip configured to include a processing circuit which processes the result of the comparison, a second signal line which is electrically connected to the processing circuit and delivers the result of the comparison to the processing circuit, and a second pad which is electrically connected to the second signal line and the first pad. Thus, it is possible to achieve an operational effect of disposing the signal input transistor and the reference input transistor in the first semiconductor chip.

In addition, according to the first aspect, the first and second pads may be electrically connected by thermal pressing. Thus, it is possible to achieve an operational effect of bonding the first pad to the second pad by thermal pressing.

In addition, according to the first aspect, the first semiconductor chip may further include a constant-current power supply which controls currents flowing in the signal input transistor and the reference input transistor. Thus, it is possible to achieve an operational effect in which a constant-current power supply is disposed in the first semiconductor chip.

In addition, according to the first aspect, the first semiconductor chip may further include a load portion which converts the change in the current into a change in a voltage, and the first signal line may deliver the change in the voltage as the result of the comparison. Thus, it is possible to achieve an operational effect in which a load portion is disposed in the first semiconductor chip.

In addition, according to the first aspect, the processing circuit may perform a process of retaining a digital signal corresponding to the reference signal on the basis of the output result of the comparison, and outputting the retained digital signal as a result of analog-digital conversion performed on the input signal. Thus, it is possible to achieve an operational effect in which the result obtained by performing the analog-digital conversion on the input signal is retained in the second semiconductor chip.

In addition, according to the first aspect, the first semiconductor chip may further include a photoelectric converter which generates the input signal, and in the signal input transistor, the generated input signal may be input to the control terminal. Thus, it is possible to achieve an operational effect in which the photoelectric converter is disposed in the first semiconductor chip.

In addition, according to a second aspect of the present technology, a method of manufacturing an imaging device includes: a step of forming a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line; a step of forming a second semiconductor chip configured to include a processing circuit which processes the result of the comparison, a second signal line which is electrically connected to the processing circuit and delivers the result of the comparison to the processing circuit, and a second pad which is electrically connected to the second signal line; and a step of bonding the first semiconductor chip and the second semiconductor chip in a state in which the first pad and the second pad come into contact with each other. Thus, it is possible to achieve an operational effect in which the signal input transistor and the reference input transistor are disposed in the first semiconductor chip.

Advantageous Effects of Invention

According to the present technology, it is possible to obtain the advantageous effect of reducing the influence of noise in the imaging device configured with the plurality of semiconductor chips. Meanwhile, the effects described herein are not necessarily limited and may be effects described in the present disclosure.

MODE(S) FOR CARRYING OUT THE INVENTION

Hereinafter, modes for carrying out the present technology (hereinafter referred to as embodiments) will be described. The description thereof will be made in the following order.
1. First embodiment (an example of a case in which a signal input transistor, a reference input transistor, and a constant-current power supply are disposed in a pixel chip)
2. Second embodiment (an example of a case in which a signal input transistor and a reference input transistor are disposed in a pixel chip)
3. Third embodiment (an example of a case in which a signal input transistor, a reference input transistor, and a load portion are disposed in a pixel chip)
4. Fourth embodiment (an example of a case in which a signal input transistor, a reference input transistor, a constant-current power, and a bias power circuit are disposed in a pixel chip)
5. Fifth embodiment (an example of a case in which orientations of currents flowing in a case in which a signal input transistor and a reference input transistor are aligned)
6. Sixth embodiment (an example of a case in which a dummy transistor is disposed)

Figure 1:
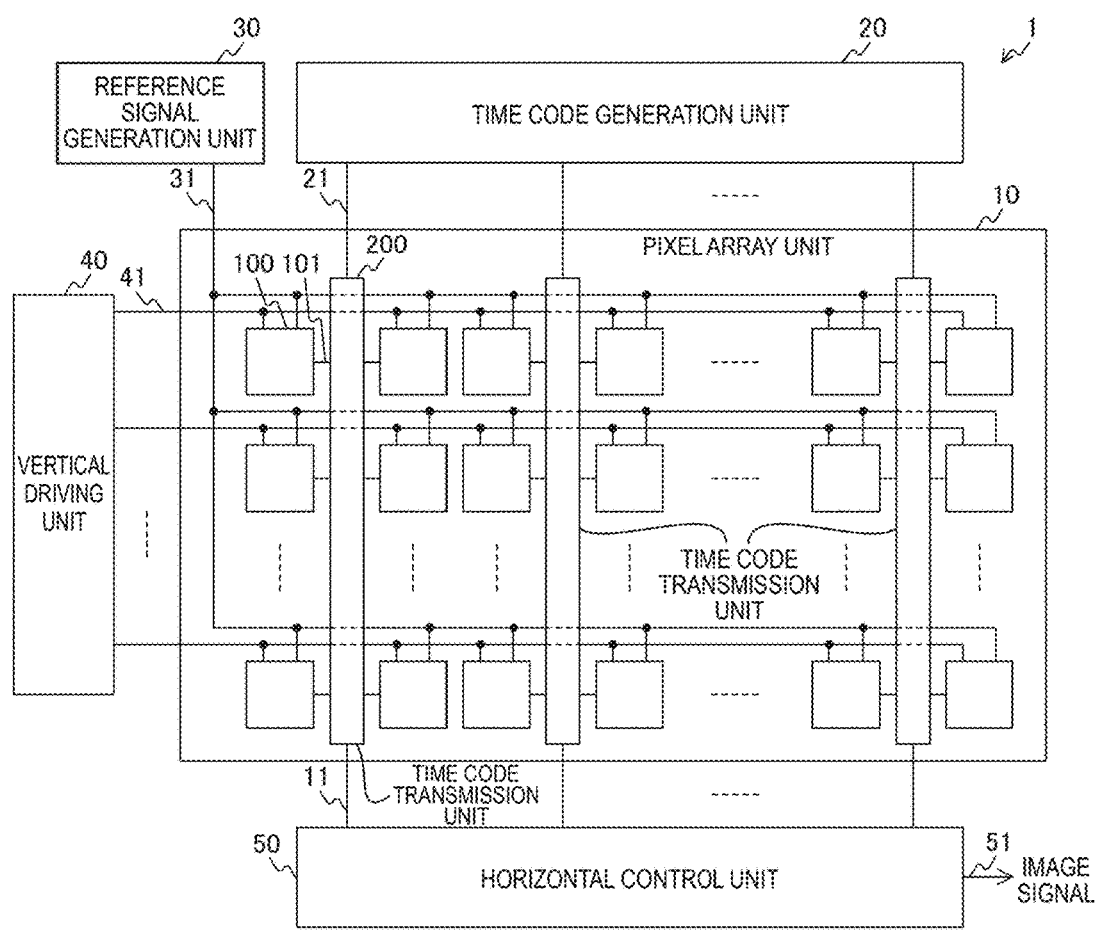
FIG. 1 is a diagram illustrating a configuration example of an imaging device 1 according to an embodiment of the present technology.

<1.First Embodiment>
[Configuration of Imaging Device]
FIG. 1 is a diagram illustrating a configuration example of an imaging device 1 according to an embodiment of the present technology. The imaging device 1 includes a pixel array unit 10, a time code generation unit 20, a reference signal generation unit 30, a vertical driving unit 40, and a horizontal control unit 50.

In the pixel array unit 10, a plurality of pixels 100 are disposed to generate image signals. The pixel array unit 10 is configured with the pixels 100 that are disposed in a 2-dimensional matrix form and generate image signals and a plurality of time code transmission units 200 that are disposed between pixel columns. The pixel 100 performs photoelectric conversion to generate an analog image signal and performs analog-digital conversion on the analog image signal. Thereafter, the pixel 100 outputs a time code to be described as a result of the analog-digital conversion. The time code transmission unit 200 transmits the time code. A signal line 101 is a signal line that connects the pixel 100 to the time code transmission unit 200. The details of the configurations of the pixel 100 and the time code transmission unit 200 will be described below.

The time code generation unit 20 generates a time code and outputs the time code to the time code transmission unit 200. Here, the time code is a code indicating a time elapsed from start of the analog-digital conversion in the pixel 100. The time code has the same size as the number of bits of a converted digital image signal. For example, a gray code can be used. The time code is output to the time code transmission unit 200 via the signal line 21.

The reference signal generation unit 30 generates a reference signal and outputs the reference signal to the pixel 100. The reference signal is a signal that serves as a standard for the analog-digital conversion in the pixel 100. For example, a signal of which a voltage is lowered in a lamp form can be used. The reference signal is output via the signal line 31. Also, the generation and the output of the time code by the time code generation unit 20 are performed in synchronization with the generation and the output of the reference signal by the reference signal generation unit 30. Thus, the time code and the reference signal output from the time code generation unit 20 and the reference signal generation unit 30 are one-to-one correspondent, and thus a voltage of the reference signal can be acquired from the time code. A time code decoding unit 52 to be described below performs decoding by acquiring the voltage of the reference signal from the time code.

The vertical driving unit 40 generates and outputs a control signal of the pixel 100 and power necessary for an operation of the pixel 100. The control signal and the like are output to the pixel 100 via the signal line 41.

The horizontal control unit 50 processes the time code transmitted by the time code transmission unit 200. The time code is input to the horizontal control unit 50 via the signal line 11. The details of the configuration of the horizontal control unit 50 will be described below.

[Configuration of Horizontal Control Unit]

Figure 2:
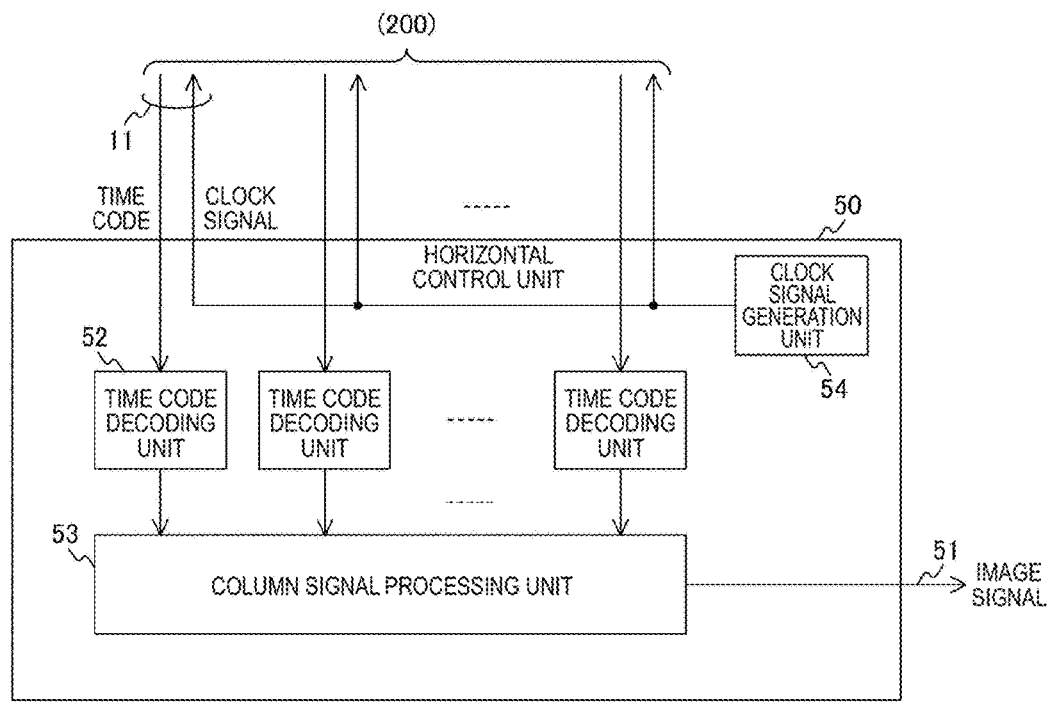
FIG. 2 is a diagram illustrating a configuration example of a horizontal control unit 50 according to the embodiment of the present technology.

FIG. 2 is a diagram illustrating a configuration example of the horizontal control unit 50 according to the embodiment of the present technology. The horizontal control unit 50 includes the time code decoding units 52, a column signal processing unit 53, and a clock signal generation unit 54.

The time code decoding unit 52 decodes the time code. Through the decoding, a digital image signal which is a result of the analog-digital conversion is generated. The plurality of time code decoding units 52 are disposed in the horizontal control unit 50 and are one-to-one correspondent to the time code transmission units 200 disposed in the pixel array unit 10. The time codes are simultaneously input from the corresponding time code transmission units 200 to the time code decoding units 52. The input time codes are decoded simultaneously and concurrently by the time code decoding units 52. Thereafter, the plurality of decoded digital image signals are input to the column signal processing unit 53.

The column signal processing unit 53 processes the digital image signals output by the time code decoding units 53. As this process, correlated double sampling (CDS) to be described below can be performed. Also, the column signal processing unit 53 performs horizontal transmission on the processed digital image signals. In the horizontal transmission, the processed image signals corresponding to the plurality of digital image signals simultaneously input by the plurality of time code decoding units 52 are transmitted and output in order. The image signal output from the column signal processing unit 53 corresponds to an output image signal of the imaging device 1.

[Configuration of Pixel]

Figure 3:
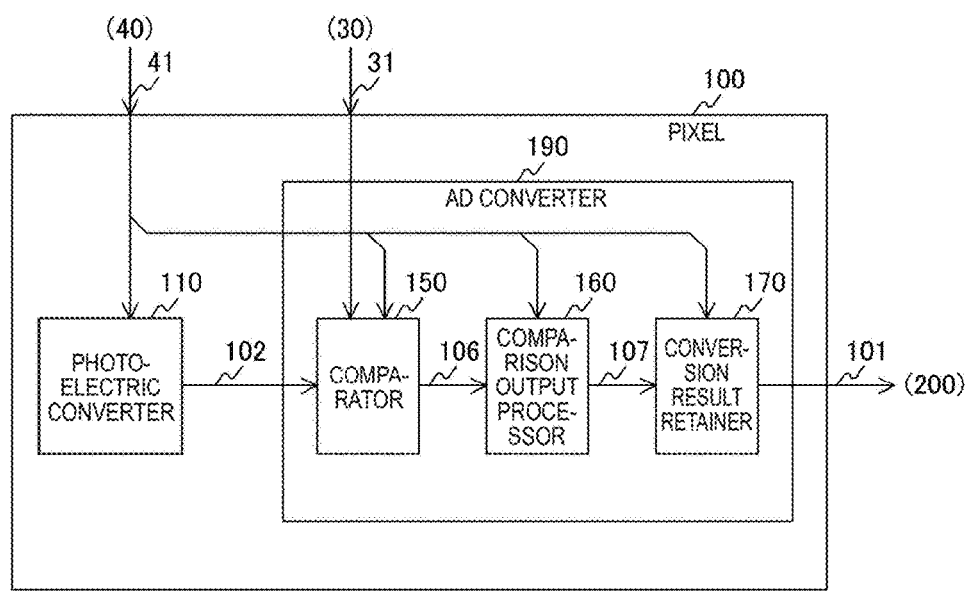
FIG. 3 is a diagram illustrating a configuration example of a pixel 100 according to the embodiment of the present technology.

FIG. 3 is a diagram illustrating a configuration example of the pixel 100 according to the embodiment of the present technology. The pixel 100 includes a photoelectric converter 110 and an analog-digital converter (AD converter) 190.

The photoelectric converter 110 performs photoelectric conversion to generate an analog image signal in accordance with incident light and retain the analog image signal. Also, the photoelectric converter 110 is controlled by the vertical driving unit 40 to output the retained analog image signal to the comparator 150 of the analog-digital converter 190. The analog image signal is output to the comparator 150 via the signal line 102. The details of the configuration of the photoelectric converter 110 will be described below.

The analog-digital converter 190 performs analog-digital conversion on the analog image signal generated by the photoelectric converter 110. The analog-digital converter 190 includes the comparator 150, a comparison output processor 160, and a conversion result retainer 170.

The comparator 150 compares the reference signal generated by the reference signal generation unit 30 with the analog image signal output by the photoelectric converter 110. A comparison result is output to the comparison output processor 160 via the signal line 106. The comparison result is output as an electric signal. For example, a signal which has a time value "1" at which a voltage of the analog image signal is less than a voltage of the reference signal and a time value "0" at which the voltage of the analog image signal is greater than the voltage of the reference signal can be output. The details of the configuration of the comparator 150 will be described below.

The comparison output processor 160 processes the comparison result output by the comparator 150 and outputs the processed comparison result to the conversion result retainer 170. The processed comparison result is output to the conversion result retainer 170 via the signal line 107. As the process, for example, level conversion or waveform shaping can be performed.

The conversion result retainer 170 retains a time code output from the time code transmission unit 200 as a result of the analog-digital conversion on the basis of the processed comparison result output by the comparison output processor 160. For example, when the comparison result is changed from the value "1" to "0", the conversion result retainer 170 retains the time code output from the time code transmission unit 200. At this time, the time code is a time code which is generated by the time code generation unit 20 and is transmitted to the pixel 100 by the time code transmission unit 200. Thereafter, the conversion result retainer 170 is controlled by the vertical driving unit 40 to output the retained time code to the time code transmission unit 200. The time code transmission unit 200 transmits the output time code to the time code decoding unit 52 of the horizontal control unit 50.

As described above, a signal changing from a high voltage to a low voltage in a lamp form is used as a reference signal, and a time code at the time of transition from a state in which the voltage of the reference signal is higher than the voltage of the analog image signal to a state in which the voltage of the reference signal is less than the voltage of the analog image signal can be retained in the conversion result retainer 170. That is, a time code at a time at which the analog image signal is substantially the same as the reference signal is retained in the conversion result retainer 170. The retained time code is converted into a digital signal indicating a voltage of the reference signal at a corresponding time in the time code decoding unit 52. Thus, it is possible to perform analog-digital conversion on the analog image signal generated by the photoelectric converter 110. In addition, the comparison output processor 160 and the conversion result retainer 170 are an example of a processing circuit described in the claims.

[Configuration of Photoelectric Converter]

Figure 4:
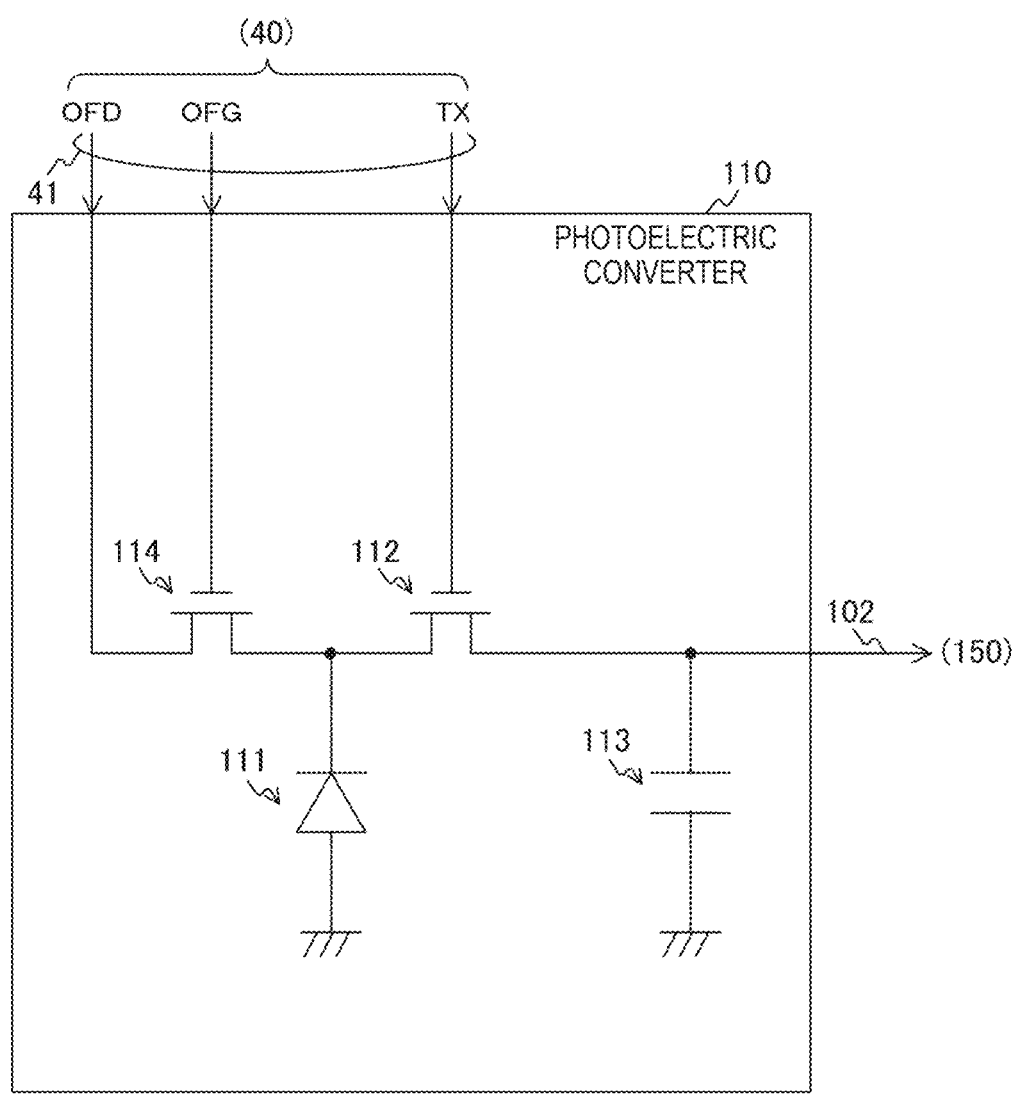
FIG. 4 is a diagram illustrating a configuration example of a photoelectric converter 110 according to the embodiment of the present technology.

FIG. 4 is a diagram illustrating a configuration example of the photoelectric converter 110 according to the embodiment of the present technology. The photoelectric converter 110 includes a photoelectric conversion element 111, an overflow gate 114, a charge transmitter 112, and a generated charge retainer 113. Here, N-channel MOS transistors can be used for the overflow gate 114 and the charge transmitter 112. Also, a plurality of signal lines (OFD, OFG, and TX) are connected to the photoelectric converter 110. The overflow drain signal line OFD (overflow drain) is a signal line that supplies a reset voltage of the photoelectric conversion element 111. The overflow gate signal line OFG (overflow gate) is a signal line that delivers a control signal to the overflow gate 114. The transmission signal line TX (transfer) is a signal line that delivers a control signal to the charge transmitter 112. As illustrated in the drawing, both the overflow gate signal line OFG and the transmission signal line TX are connected to the gate of the MOS transistor. When a voltage equal to or greater than a threshold voltage between the gate and the source (hereinafter referred to as an ON-signal) is input via the signal line, the corresponding MOS transistor enters a conductive state.

The drain and the gate of the overflow gate 114 are connected to the overflow drain signal line OFD and the overflow gate signal line OFG, respectively. The source of the overflow gate 114 is connected to the cathode of the photoelectric conversion element 111 and the source of the charge transmitter 112. The anode of the photoelectric conversion element 111 is grounded. The gate of the charge transmitter 112 is connected to the transmission signal line TX and the drain of the charge transmitter 112 is connected to the signal line 102. The other end of the generated charge retainer 113 is grounded.

The photoelectric conversion element 111 generates a charge in accordance with the amount of radiated light and retains the generated charge. A photodiode can be used for the photoelectric conversion element 111.

The overflow gate 114 discharges the charge generated in surplus in the photoelectric conversion element 111. Also, the overflow gate 114 further discharges the charge accumulated in the photoelectric conversion element 111 by electrifying between the photoelectric conversion element 111 and the overflow drain signal line OFD. That is, resetting of the photoelectric conversion element 111 is further performed.

The charge transmitter 112 transmits the charge generated by the photoelectric conversion element 111 to the generated charge retainer 113. The charge transmitter 112 transmits the charge by electrifying between the photoelectric conversion element 111 and the generated charge retainer 113.

The generated charge retainer 113 retains the charge transmitted by the charge transmitter 112. As the generated charge retainer 113, a floating diffusion region formed in a diffusion layer of a semiconductor substrate can be used. A signal in accordance with the charge retained in the generated charge retainer 113 corresponds to the analog image signal generated by the photoelectric converter 110 and is output to the comparator 150 via the signal line 102.

[Configuration of Comparator]

Figure 5:
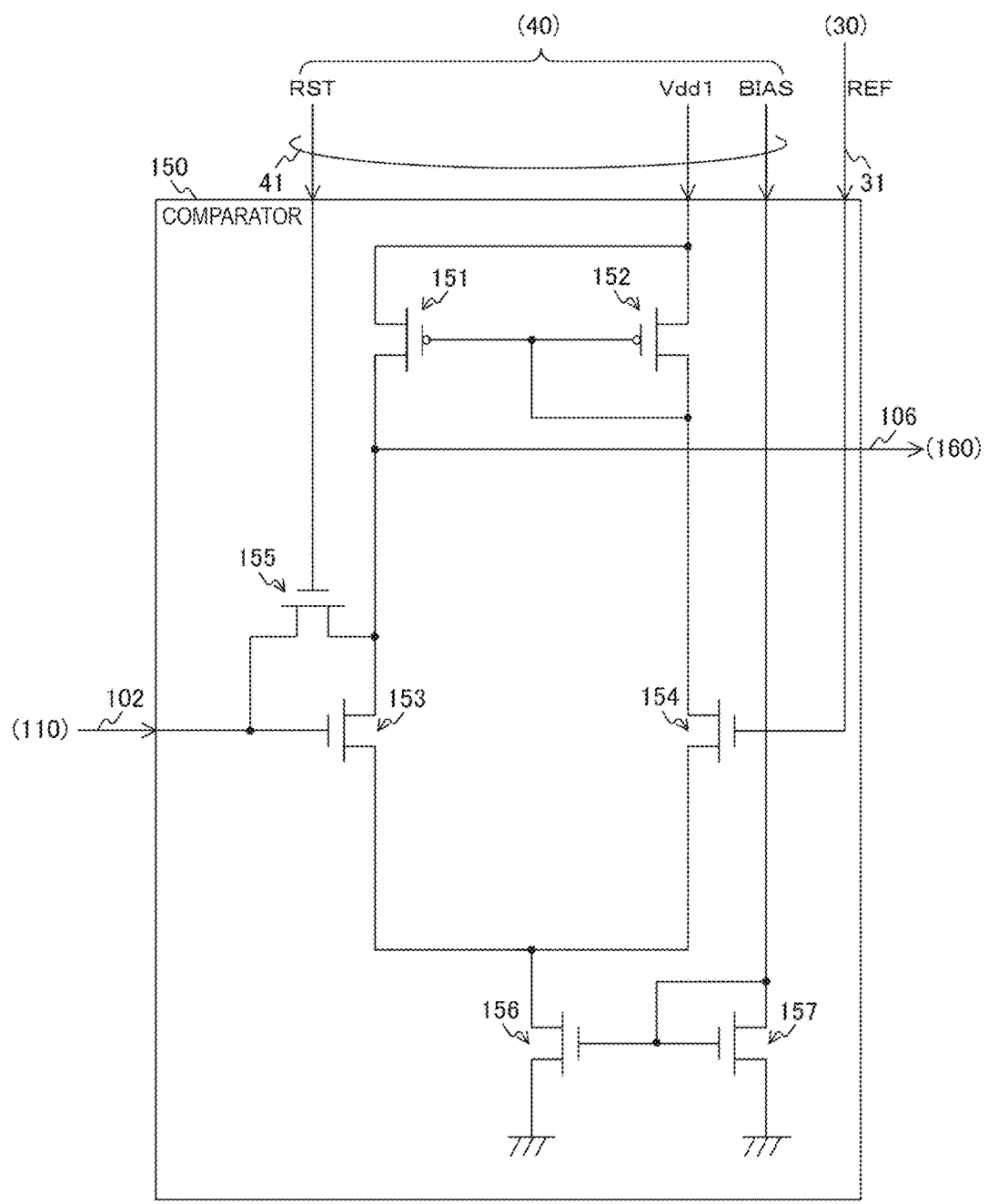
FIG. 5 is a diagram illustrating a configuration example of a comparator 150 according to the embodiment of the present technology.

FIG. 5 is a diagram illustrating a configuration example of the comparator 150 according to the embodiment of the present technology. The comparator 150 includes a signal input transistor 153, a reference input transistor 154, and MOS transistors 151, 152, 155, 156, and 157. Here, P-channel MOS transistors can be used for the MOS transistors 151 and 152. N-channel MOS transistors can be used for the MOS transistors 155 to 157. Similarly, N-channel MOS transistors can also be used for the signal input transistor 153 and the reference input transistor 154. In addition, the MOS transistor 151 is an example of a load portion described in the claims.

Also, a plurality of signal lines (RST, BIAS, and REF) and a power line Vdd1 are connected to the comparator 150 in addition to the above-described signal lines 102 and the like. The reset signal line RST (reset) is a signal line that delivers a control signal to the MOS transistor 155. The bias signal line BIAS (bias) is a signal line that supplies a bias current to the MOS transistor 157. The reference signal line REF (reference) is a signal line that delivers a reference signal to the reference input transistor 154. The power line Vdd1 is a power line that supplies power to the comparator 150.

The sources of the MOS transistors 151 and 152 are commonly connected to the power line Vdd1. The gate of the MOS transistor 151 is connected to the gate and the drain of the MOS transistor 152 and the drain of the reference input transistor 154. The drain of the MOS transistor 151 is connected to the drain of the signal input transistor 153, the drain of the MOS transistor 155, and the signal line 106. The source of the signal input transistor 153 and the source of the reference input transistor 154 are commonly connected to the drain of the MOS transistor 156. The gate of the MOS transistor 156 is connected to the gate and the drain of the MOS transistor 157 and the bias signal line BIAS. The sources of the MOS transistor 156 and the MOS transistor 157 are grounded. The gate of the MOS transistor 155 is connected to the reset signal line RST and the source of the MOS transistor 155 is connected to the gate of the signal input transistor 153 and the signal line 102. The gate of the MOS transistor 154 is connected to the reference signal line REF.

The signal input transistor 153 is a MOS transistor in which an input signal is input to a gate serving as a control terminal. The analog image signal is input as the input signal to the signal input transistor 153 in the drawing.

The reference input transistor 154 is a MOS transistor in which the reference signal is input to a gate serving as a control terminal. The reference input transistor 154 and the signal input transistor 153 form a differential pair. The differential pair compares the input signal to the reference signal. Specifically, in a case in which the input signal is less than the reference signal, a current flowing in the reference input transistor 154 is greater than a current flowing in the signal input transistor 153. In contrast, in a case in which the input signal is greater than the reference signal, the current flowing in the reference input transistor 154 is less than a current flowing in the signal input transistor 153. In this way, a current in accordance with a difference between the input signal and the reference signal flows in the signal input transistor 153 and the reference input transistor 154 that form the differential pair.

The MOS transistor 155 resets the generated charge retainer 113 described in FIG. 4. The resetting can be performed as follows. First, a voltage equivalent to a reset voltage of the generated charge retainer 113 is applied to the reference signal line REF. Thus, the reference input transistor 154 enters a conductive state. At this time, a voltage of the drain of the MOS transistor 155 is also substantially the same as the reset voltage by an operational effect of a current mirror circuit that is formed by the MOS transistors 151 and 152 and a differential amplifier circuit. Subsequently, the ON-signal is input to the reset signal line RST so that the MOS transistor 155 enters a conductive state. Thus, the reset voltage can be applied to the generated charge retainer 113 of the photoelectric converter 110 to perform resetting.

When a current flowing in any one of the signal input transistor 153 and the reference input transistor 154 is changed in accordance with a difference between the input signal and the reference signal, the MOS transistor 151 converts the change in the current into a change in a voltage. The MOS transistor 152 converts the change in the current flowing in the reference input transistor 154 into a change in a voltage. The MOS transistors 151 and 152 form the current mirror circuit. The current mirror circuit operates such that the same current as the current flowing in the reference input transistor 154 flows in the signal input transistor 153. Thus, it is possible to compare the input signal to the reference signal at a high speed.

The MOS transistor 156 controls the currents flowing in the signal input transistor 153 and the reference input transistor 154 that forms the differential pair. The MOS transistors 156 and 157 form a current mirror circuit. A predetermined bias current is supplied to the drain of the MOS transistor 157 by the bias signal line BIAS. Substantially the same current as the bias current also flows in the MOS transistor 156. That is, substantially the same current as a current supplied to the bias signal line BIAS flows in the differential pair that is formed by the signal input transistor 153 and the reference input transistor 154. In addition, a gate voltage of the MOS transistor 157 can also be distributed to the comparators 150 in the plurality of pixels 100.

In addition, the configuration of the comparator 150 is not limited to this example. For example, a resistive load or a constant-current power supply can also be used instead of the MOS transistors 151 and 152 that form the current mirror circuit. At this time, the resistive load or the like can be connected to one or both of the signal input transistor 153 and the reference input transistor 154 in the differential pair.

[Configuration of Comparison Output Processor]

Figure 6:
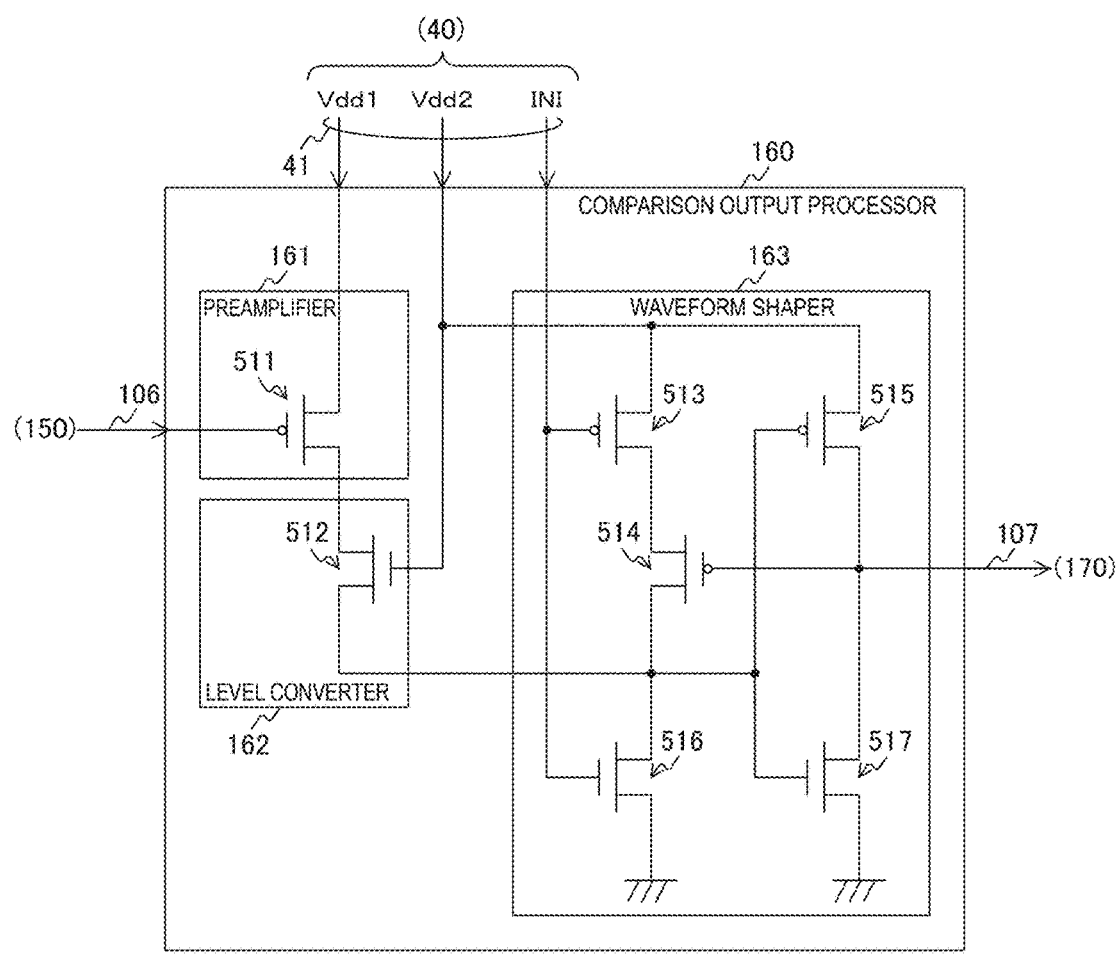
FIG. 6 is a diagram illustrating a configuration example of a comparison output processor 160 according to the embodiment of the present technology.

FIG. 6 is a diagram illustrating a configuration example of the comparison output processor 160 according to the embodiment of the present technology. The comparison output processor 160 includes MOS transistors 511 to 517. Here, the MOS transistors 511, 513, and 515 can be configured with P-channel MOS transistors. Also, the MOS transistors 512, 514, 516, and 517 can be configured with N-channel MOS transistors. In addition, the MOS transistor 511 forms a preamplifier 161. The MOS transistor 512 forms a level converter 162. The MOS transistors 513 to 517 form a waveform shaper 163. Also, an initialization signal line INI (initialize) and power lines (Vdd1 and Vdd2) are connected to the comparison output processor 160 in addition to the above-described signal lines 106 and 107. The initialization signal line INI is a signal line that delivers a control signal to the MOS transistors 513 and 516. The power lines Vdd1 and Vdd2 are power lines that supply power to the comparison output processor 160.

The source and the gate of the MOS transistor 511 are connected to the power line Vdd1 and the signal line 106, respectively. The drain of the MOS transistor 511 is connected to the drain of the MOS transistor 512. The gate of the MOS transistor 512 is connected to the power line Vdd2 and the source of the MOS transistor 512 is connected to the drains of the MOS transistors 514 and 516 and the gates of the MOS transistor 515 and 517. The gates of the MOS transistors 513 and 516 are commonly connected to the initialization signal line INI. The source and the drain of the MOS transistor 513 are connected to the power line Vdd2 and the source of the MOS transistor 514, respectively. The source of the MOS transistor 516 is grounded. The gate of the MOS transistor 514 is connected to the drain of the MOS transistors 515 and 517 and the signal line 107. The source of the MOS transistor 515 is connected to the power line Vdd2 and the source of the MOS transistor 517 is grounded.

The preamplifier 161 amplifies a signal corresponding to a comparison result output by the comparator 150. The preamplifier 161 outputs the amplified signal to the level converter 162. The amplification is performed by the MOS transistor 511.

The level converter 162 performs level conversion of a signal output by the preamplifier 161. The power line Vdd1 is connected to the comparator 150 described in FIG. 5 and the preamplifier 161. To obtain a high gain in the comparator 150 and the preamplifier 161, it is necessary to set power supplied by the power line Vdd1 as a relatively high voltage. On the other hand, since the conversion result retainer 170 or the like on the rear stage handles a digital signal, power with a relatively low voltage can be supplied. The relatively low power is supplied by the power line Vdd2. Thus, it is possible to reduce power consumption of the conversion result retainer 170 or the like and it is possible to use a low pressure-resistant transistor for the conversion result retainer 170 or the like. In this way, the level converter 162 is disposed to deliver a signal between circuits to which power with different voltages is supplied. Thus, a signal subjected to level conversion is output to the waveform shaper 163. The level converter 162 in the drawing can restrict a signal level to a voltage obtained by reducing a power voltage supplied by the power line Vdd2 by a threshold voltage of the MOS transistor 512.

The waveform shaper 163 shapes a signal output by the level converter 162 to a signal which changes steeply. An operation of the waveform shaper 163 will be described. In an initial state, an output of the level converter 162 has a value of "0." In this state, a signal with a value of "1" is input from the initialization signal line INI so that the MOS transistor 516 enters the conductive state. Thus, the MOS transistor 517 enters the non-conductive state and the MOS transistor 515 enters the conductive state. A value "1" is output to the signal line 107. At this time, the MOS transistors 513 and 514 enter the non-conductive state. Thereafter, a signal with a value of "0" is input to the initialization signal line INI. Thus, the MOS transistor 513 enters the conductive state and the MOS transistor 516 enters the non-conductive state. Since the MOS transistor 514 is in the non-conductive state and the output signal of the level converter 162 has the value of "0," the states of the MOS transistors 515 and 517 are not changed.

Subsequently, when the output signal of the level converter 162 is changed from the value of "0" to the value of "1," the state of the MOS transistor 517 transitions to the conductive state and the state of the MOS transistor 515 transitions to the non-conductive state. Thus, the voltage of the signal line 107 is lowered. Therefore, the state of the MOS transistor 514 transitions to the conductive state and the voltages of the gates of the MOS transistors 515 and 517 are further raised. The voltage of the signal line 107 is abruptly lowered by the positive feedback operational effect. Thus, it is possible to shape a waveform.

In addition, the configuration of the comparison output processor 160 is not limited to this example. For example, a configuration in which a part or all of the comparison output processor 160 is omitted can also be adopted.

[Configuration of Conversion Result Retainer]

Figure 7:
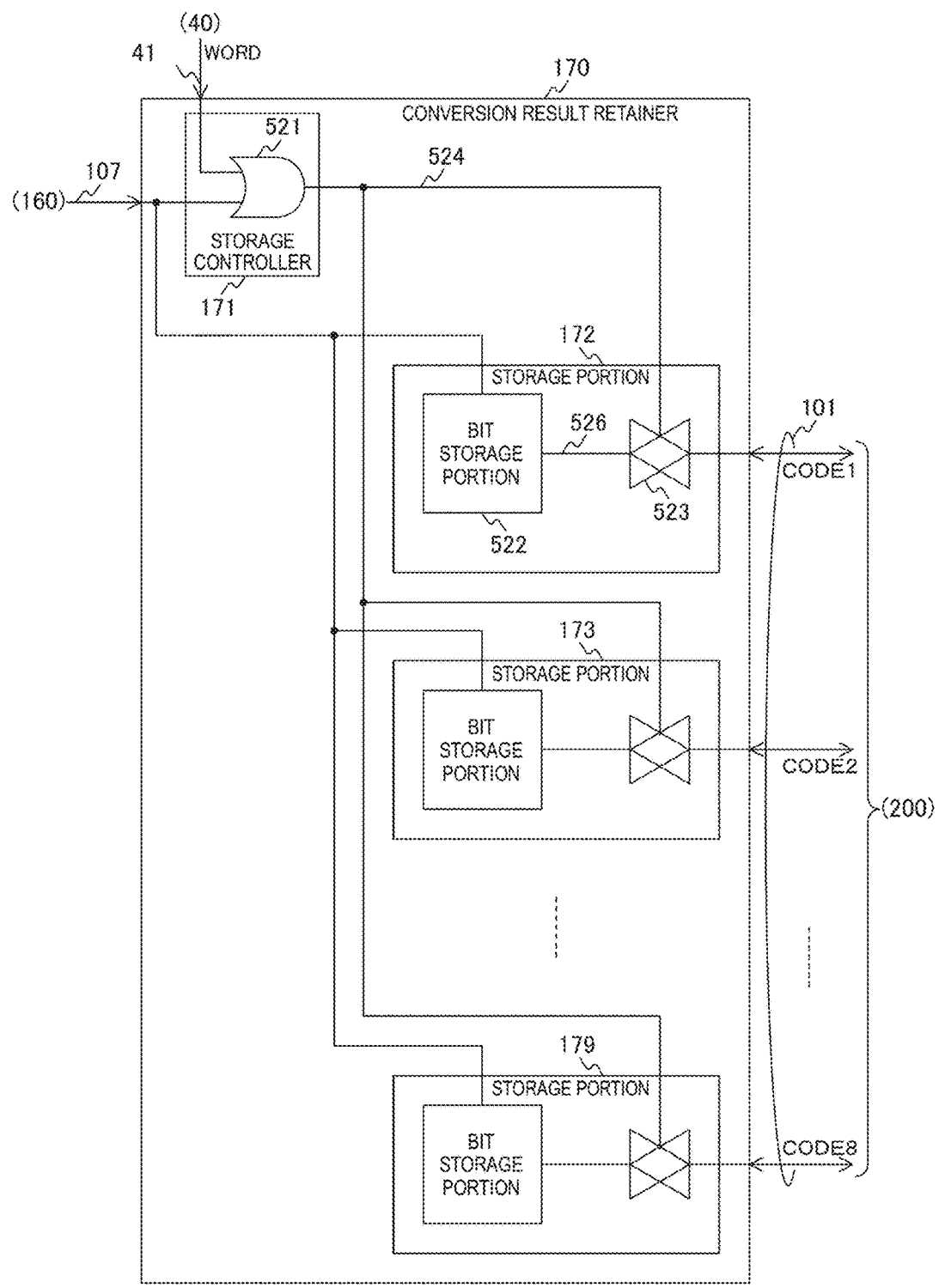
FIG. 7 is a diagram illustrating a configuration example of a conversion result retainer 170 according to the embodiment of the present technology.

FIG. 7 is a diagram illustrating a configuration example of the conversion result retainer 170 according to the embodiment of the present technology. The conversion result retainer 170 includes a storage controller 171 and storage portions 172 to 179. Here, for convenience, data with an 8-bit size is assumed as a digital image signal after analog-digital conversion. Therefore, the size of a time code is also 8 bits. In addition, the sizes of the digital image signal and the time code after the conversion can be changed to meet a request to a system. For example, a 15-bit size can also be used.

Also, a plurality of signal lines (WORD and CODE1 to CODE8) are connected to the conversion result retainer 170 in addition to the signal line 107. The word signal line WORD (word) is a signal line that delivers control signals of the storage portions 172 to 179. The code signal lines CODE1 to CODE8 (code) are signal lines that deliver the time codes bidirectionally. The plurality of code signal lines CODE1 to CODE8 form a signal line 101.

The storage portions 172 to 179 each store a time code input from the time code transmission unit 200. The storage portions 172 to 179 each store a 1-bit time code. The configurations of the storage portions 172 to 179 will be described exemplifying the storage portion 172. The storage portion 172 includes a bit storage portion 522 and a bidirectional switch 523.

The bidirectional switch 523 is connected between a signal line 526 and the code signal line CODE1 to deliver data bidirectionally. Also, the bidirectional switch 523 includes a control input terminal. A signal line 524 is connected to the control input terminal. When the value of "1" is input to the control input terminal via the signal line 524, the bidirectional switch 523 enters the conductive state, and thus data can be delivered bidirectionally between the signal line 526 and the code signal line CODE1. On the other hand, when the value of "0" is input to the control input terminal, the bidirectional switch 523 enters the non-conductive state.

The bit storage portion 522 is a storage device that stores 1-bit data. The bit storage portion 522 includes an input and output terminal and a control input terminal which are connected to the signal lines 526 and 107, respectively. When a signal with the value of "1" is input to the control input terminal via the signal line 107, the bit storage portion 522 stores the 1-bit time code which is a signal delivered from the bidirectional switch 523 via the signal line 526. At this time, in a case in which the 1-bit time code is changed, data stored in the bit storage portion 522 can be rewritten. Thereafter, when the signal input to the control input terminal transitions from the value of "1" to the value of "0," the data stored in the bit storage portion 522 is retained without change. That is, until the signal input to the control input terminal becomes the value of "1," the above-described update of the data is not performed. Also, the bit storage portion 522 outputs the retained data to the signal line 526 when the signal input to the control input terminal has the value of "0."

The storage controller 171 outputs a control signal via the signal line 524 to control the storage portions 172 to 179. The storage controller 171 can generate, for example, a signal obtained by performing logical OR of two signals input by the word signal line WORD and the signal line 107 as the control signal of the bidirectional switch 523 and can output the signal. This can be performed by an OR gate 521.

[Configuration of Time Code Transmission Unit]

Figure 8:
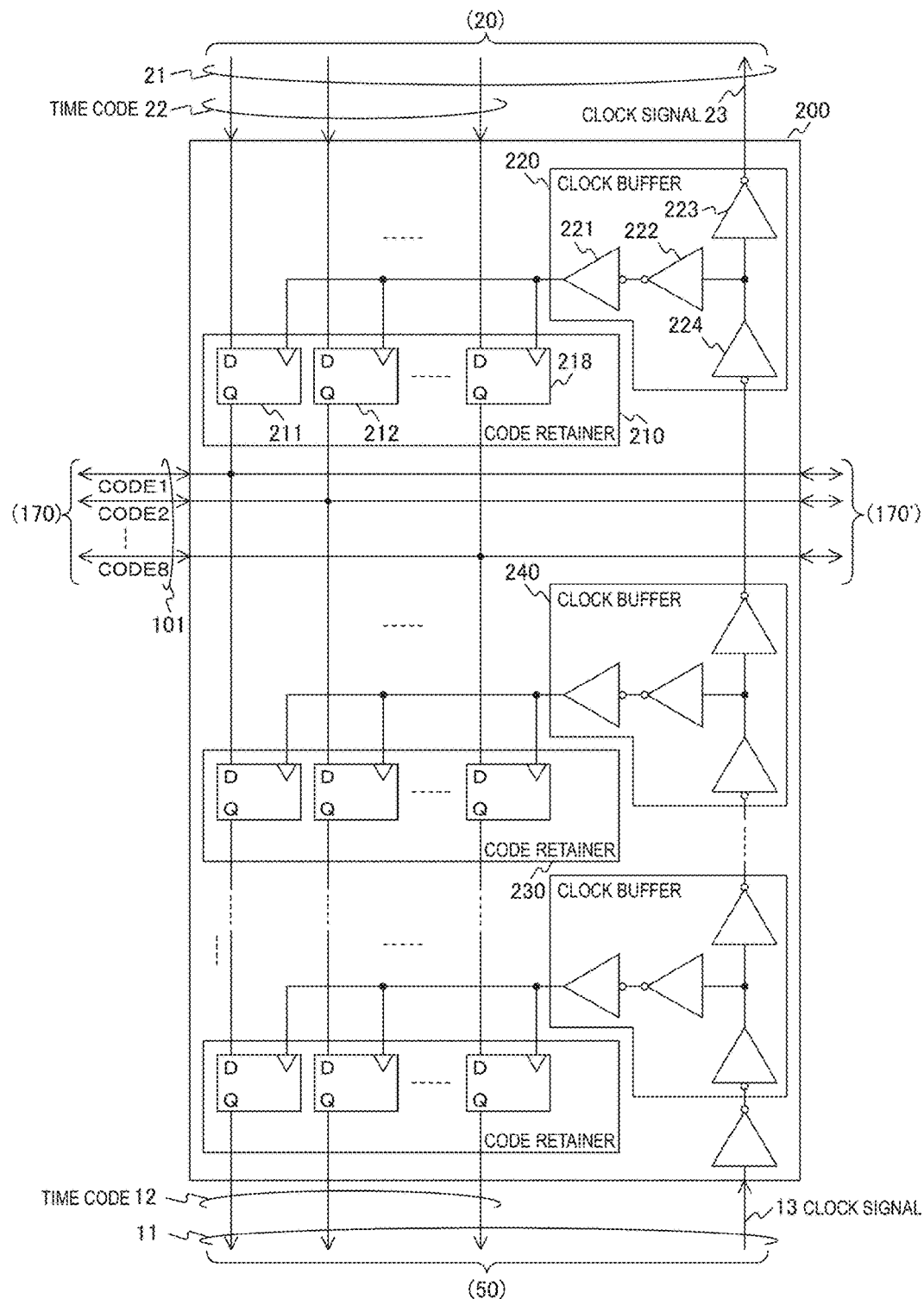
FIG. 8 is a diagram illustrating a configuration example of a time code transmission unit 200 according to the embodiment of the present technology.

FIG. 8 is a diagram illustrating a configuration example of the time code transmission unit 200 according to the embodiment of the present technology. The time code transmission unit 200 includes code retainers 210 and 230 and clock buffers 220 and 240. The time code transmission unit 200 includes the same numbers of code retainers and clock buffers as the number of rows of the pixels 100 disposed in the pixel array unit 10 described in FIG. 1. For convenience, the code retainers 210 and 230 and the clock buffers 220 and 240 will be exemplified in description.

The code retainer 210 retains the time code. The code retainer 210 is configured to include flip-flops 211 to 218. The flip-flop 211 and the like retain 1 bit in the time code on the basis of the clock signal output from the clock buffer 220. Specifically, when the clock signal has the value of "0," the time code output from the time code generation unit 20 and input to a D input terminal in the drawing is retained in an internal node and a Q output terminal is set to a high impedance state. Subsequently, when the clock signal has the value of "1," the time code retained in the internal node is output from the Q output terminal. The output time code is input to the code retainer 230 via the signal line 101. In this way, the time code transmission unit 200 operates the plurality of time code retainers as shift registers and transmits the time codes.

The clock buffer 220 outputs a clock signal generated by the clock signal generation unit 54 described in FIG. 3 to the code retainer 210 and outputs the clock signal to a clock buffer on a subsequent stage. The clock buffer 220 is configured to include a plurality of inversion gates 221 to 224 and operates as a repeater that shapes a degraded clock signal. Also, the clock buffer 220 transmits the clock signal in sequence in an opposite direction to the time code in the time code transmission unit 200. That is, the clock buffer 240 outputs a clock signal to the code retainer 230 and outputs a clock signal to the clock buffer 220. Thus, the clock signal input to the code retainer 210 has a propagation delay time equivalent to two inversion gates and time delay equivalent to delay caused by a wiring up to the inversion gate 224 compared to the clock signal input to the code retainer 230. In this way, the clock buffer 220 further has a function of delaying the clock signal.

As described above, when the clock signal has the value of "0," the flip-flop 211 and the like retain the input time code in the internal node. When the time code is retained, it is necessary to ensure a predetermined time, that is, a so-called setup time. When the clock signal transitions to the value of "0" in the code retainer 230 by the delay of the clock signal caused by the clock buffer 220, the clock signal input to the code retainer 210 remains to have the value of "1." That is, the time code retained in the internal node remains to be output. Thus, it is possible to ensure the setup time in the code retainer 230 and deliver the time code.

The code signal lines CODE1 to CODE8 are connected to outputs of the code retainer 210 and inputs of the code retainer 230. Thus, the time codes generated by the time code generation unit 20 and retained in the code retainers 210 are output to the conversion result retainers 170 via the code signal lines CODE1 to CODE8. Also, the time codes retained in the conversion result retainers 170 after the analog-digital conversion are output to the code retainers 230 via the code signal lines CODE1 to CODE8. In this way, the time code transmission unit 200 transmits the time code.

[Analog-digital Conversion Process]

Figure 9:
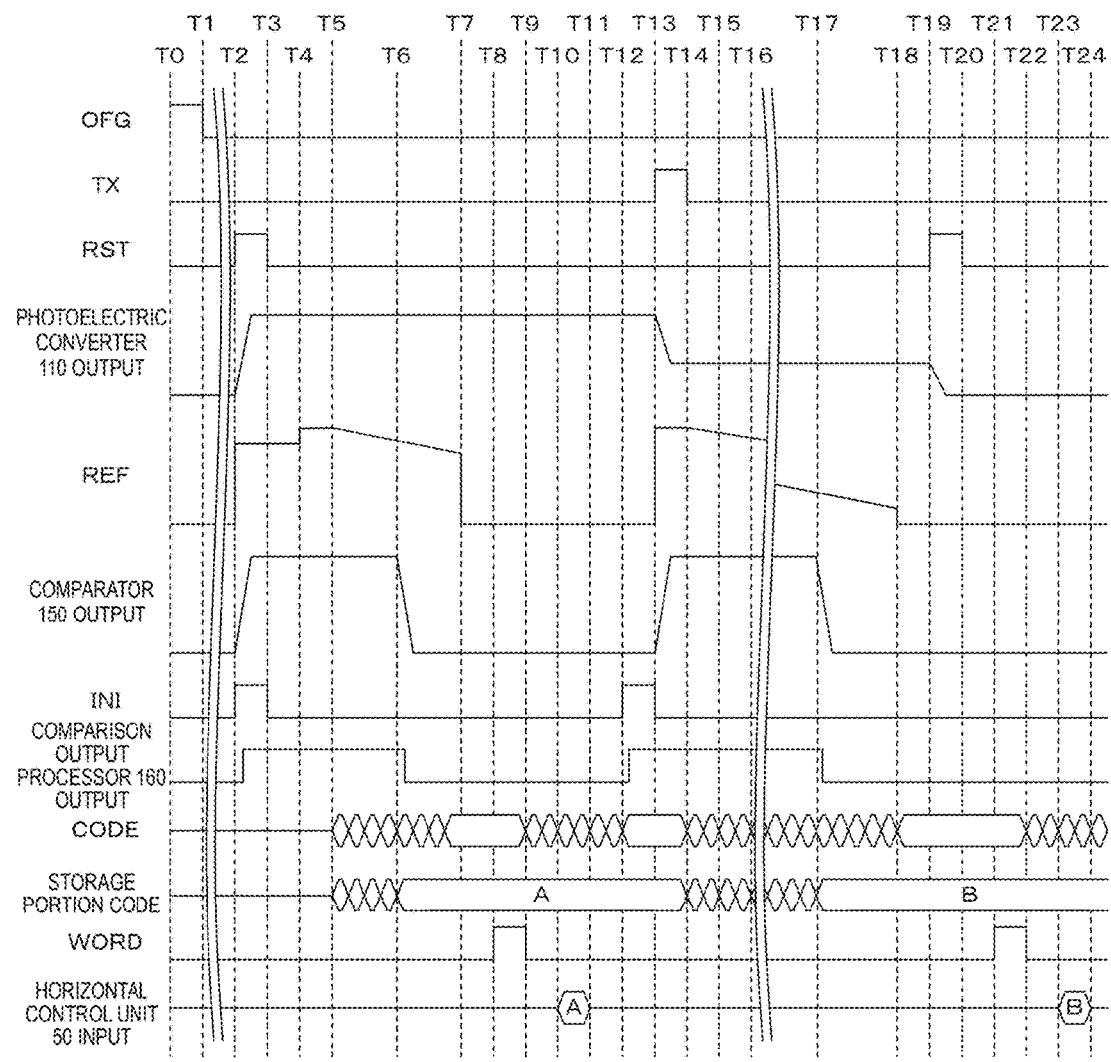
FIG. 9 is a diagram illustrating an example of an analog-digital conversion process according to the embodiment of the present technology.

FIG. 9 is a diagram illustrating an example of an analog-digital conversion process according to the embodiment of the present technology. In the drawing, the analog-digital conversion process in the photoelectric converter 110 described in FIG. 4 is illustrated. In the drawing, OFG, TX, RST, INI, and WORD indicate states of signals input to the overflow gate signal line OFG, the transmission signal line TX, the reset signal line RST, the initialization signal line INI, and the word signal line WORD, respectively. In the states, a period in which a value of a binarized waveform is "1" is equivalent to an input o the ON-signal. A photoelectric converter 110 output, REF, a comparator 150 output, and a comparison output processor 160 output indicate an output signal of the photoelectric converter 110, a reference signal of the reference signal line REF, an output signal of the comparator 150, and an output signal state of the comparison output processor 160, respectively. CODE, a storage portion code, and a horizontal control unit 50 input indicate a time code delivered by the code signal line CODE, the time codes stored in the storage portions 172 to 179, and the time code (8 bits) input to the horizontal control unit 50, respectively.

At T0 to T1, the ON-signal is input to the overflow gate signal line OFG and the photoelectric conversion element 111 of the photoelectric converter 110 is reset. Thus, exposure starts in the photoelectric converter 110.

At T2 to T3, a voltage equivalent to a reset voltage of the generated charge retainer 113 is applied to the reference signal line REF. Thus, an output of the comparator 150 is also substantially the same value as the reset voltage. Simultaneously, the ON-signal is input to the reset signal line RST. Thus, the generated charge retainer 113 is reset. Also, the ON-signal is input to the initialization signal line INI and an output of the comparison output processor 160 becomes "1."

At T4 to T7, the reference signal is input to the reference signal line REF. As illustrated in the drawing, the reference signal is a signal of which a voltage is lowered in a lamp form. A time code is generated in synchronization with inputting of the reference signal and is transmitted by the time code transmission unit 200. The transmitted time codes are stored in the storage portions 172 to 179. In addition, while the output signal of the comparison output processor 160 has the value of "1," the codes stored in the storage portions 172 to 179 are updated (T5 to T6).

When the voltage of the reference signal is less than the voltage of the output signal of the photoelectric converter 110, the output signal of the comparator 150 is lowered (T6). The output signal of the comparator 150 is shaped by the comparison output processor 160 and the signal with the value of "0" is output to the conversion result retainer 170. Then, the update of the time codes stored in the storage portions 172 to 179 is stopped and the time codes are retained. Here, the retained time code is denoted by "A." "A" is a signal corresponding to the image signal at the time of the reset of the photoelectric converter 110. After a predetermined time has elapsed, the reference signal of the reference signal line REF becomes the value of "0" and the transmission of the time code is also stopped (T7).

At T8 to T11, the ON-signal is input to the word signal line WORD (T8 to T9) and the time code "A" retained in the storage portions 172 to 179 is output to the time code transmission unit 200. Thereafter, the time code "A" is transmitted by the time code transmission unit 200 and is input to the horizontal control unit 50 (T9 to T11). The input time code "A" is decoded by the time code decoding unit 52 and is retained as an image signal at the time of the reset in the column signal processing unit 53.

At T12 to T18, the ON-signal is input to the initialization signal line INI (T12 to T13) and the output of the comparison output processor 160 becomes the value of "1." Subsequently, the ON-signal is input to the transmission signal line TX (T13 to T14) and the charge retained in the photoelectric conversion element 111 is transmitted to the generated charge retainer 113 to be retained. A signal (analog image signal) in accordance with the charge retained in the generated charge retainer 113 is output from the photoelectric converter 110 to the comparator 150. Thereafter, the reference signal is input to the reference signal line REF and the time code is transmitted (T14 to T18). When the voltage of the reference signal is less than the voltage of the output signal of the photoelectric converter 110 (T17), the signal with the value of "0" is output to the conversion result retainer 170 and the time code is retained in the storage portions 172 to 179 as in T6 described above. Here, the retained time code is denoted by "B." "B" is a signal corresponding to the image signal after exposure of the photoelectric converter 110. After a predetermined time has elapsed, the inputting of the reference signal is stopped and the reference signal has a value of about 0 V (T18).

A period from inputting of the ON-signal to the overflow gate signal line OFG at T0 to T1 described above to inputting of the ON-signal to the transmission signal line TX at T13 to T14 is equivalent to an exposure period.

At T19 to T20, the ON-signal is input to the reset signal line RST. Since the reference signal has about 0 V, as described above, an output of the photoelectric converter 110 is about 0 V. Thus, the generated charge retainer 113 is discharged to about 0 V.

At T21 to T24, the ON-signal is input to the word signal line WORD (T21 to T22) and the time code "B" is output to the time code transmission unit 200. Thereafter, at T22 to T24, the time code "B" is transmitted by the time code transmission unit 200 and is input to the horizontal control unit 50. The input time code "B" is decoded to become an image signal after the exposure and the image signal is input to the column signal processing unit 53. Thereafter, the column signal processing unit 53 subtracts the image signal at the time of the reset from the input image signal after the exposure. Thus, CDS is performed. The image signal subjected to CDS is output from the horizontal control unit 50 and becomes an output image signal of the imaging device 1.

In this way, it is possible to perform the analog-digital conversion on the image signal in the photoelectric converter 110.

[Configuration of Semiconductor Chip]

Figure 10:
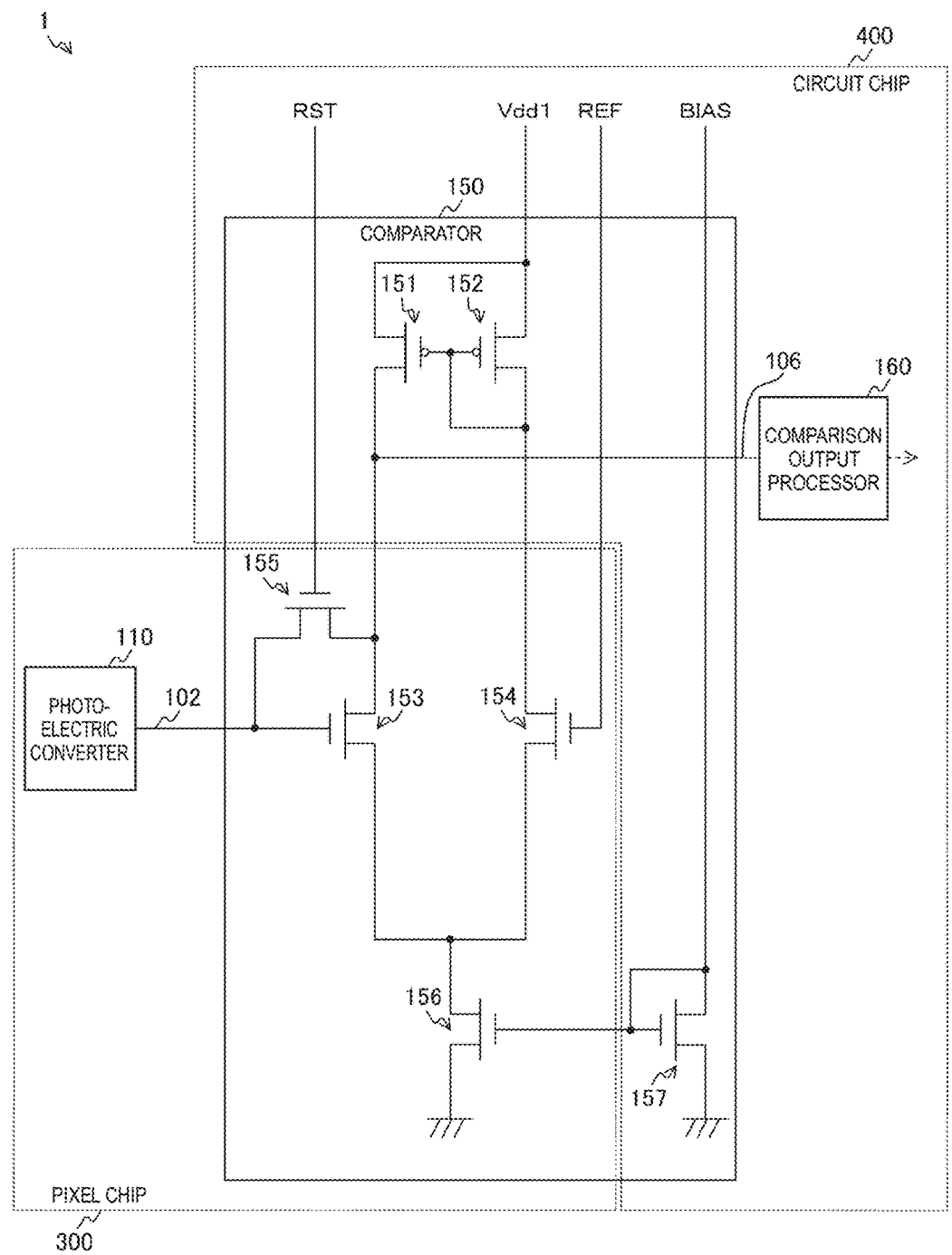
FIG. 10 is a diagram illustrating a configuration example of a semiconductor chip according to a first embodiment of the present technology.

FIG. 10 is a diagram illustrating a configuration example of the semiconductor chip according to a first embodiment of the present technology. In the drawing, a configuration of two semiconductor chips included in the imaging device 1 is illustrated. As illustrated in the drawing, the imaging device 1 is configured to include a pixel chip 300 and a circuit chip 400. In the pixel chip 300, circuits in parts of the photoelectric converter 110 and the comparator 150 in all the pixels 100 disposed in the pixel array unit 10 described in FIG. 1 are disposed. That is, the photoelectric converter 110, the signal input transistor 153, the reference input transistor 154, the MOS transistor 155, and the MOS transistor 156 are disposed in the pixel chip 300. Other portions are disposed in the circuit chip 400. In addition, the pixel chip 300 is an example of the first semiconductor chip described in the claims. The circuit chip 400 is an example of the second semiconductor chip described in the claims.

The photoelectric converter 110 is mainly disposed in the pixel chip 300 and other circuit portions are disposed in the circuit chip 400. By disposing the pixel chip 300 in a light reception surface of the imaging device 1, it is possible to enlarge the area of the photoelectric converter 110 on the light reception surface, and thus it is possible to improve an aperture ratio.

In the pixel chip 300 in the drawing, the signal input transistor 153 and the reference input transistor 154 are disposed in addition to the photoelectric converter 110. That is, the pixel chip 300 and the circuit chip 400 are separated between the drain of the signal input transistor 153 and the drain of the MOS transistor 151 and between the drain of the reference input transistor 154 and the drain of the MOS transistor 152. As described above, a current based on a difference between the input signal and the reference signal flows in the drain of the signal input transistor 153. The current is amplified by the differential pair formed by the signal input transistor 153 and the reference input transistor 154, and thus a signal level (amplitude) becomes relatively high. Therefore, even in a case in which the two semiconductor chips are separated therebetween, it is possible to reduce an influence of noise.

Also, the signal input transistor 153 and the reference input transistor 154 have larger sizes than the MOS transistors disposed in the photoelectric converter 110. This is because a gain increases. However, since the sizes are large, stray capacitance also increases. Accordingly, by disposing the transistors in the same semiconductor chip (the pixel chip 300) and directly connecting the transistors to the photoelectric converter 110, it is possible to reduce an influence of the stray capacitance.

Further, since the signal line 102 is connected to the gate of the signal input transistor 153, the signal line 102 is a wiring in which impedance is relatively high and noise is easily mixed. By disposing the signal input transistor 153 in the pixel chip 300, it is possible to shorten the wiring of the signal line 102, and thus it is possible to further reduce the influence of the noise.

Figure 11:
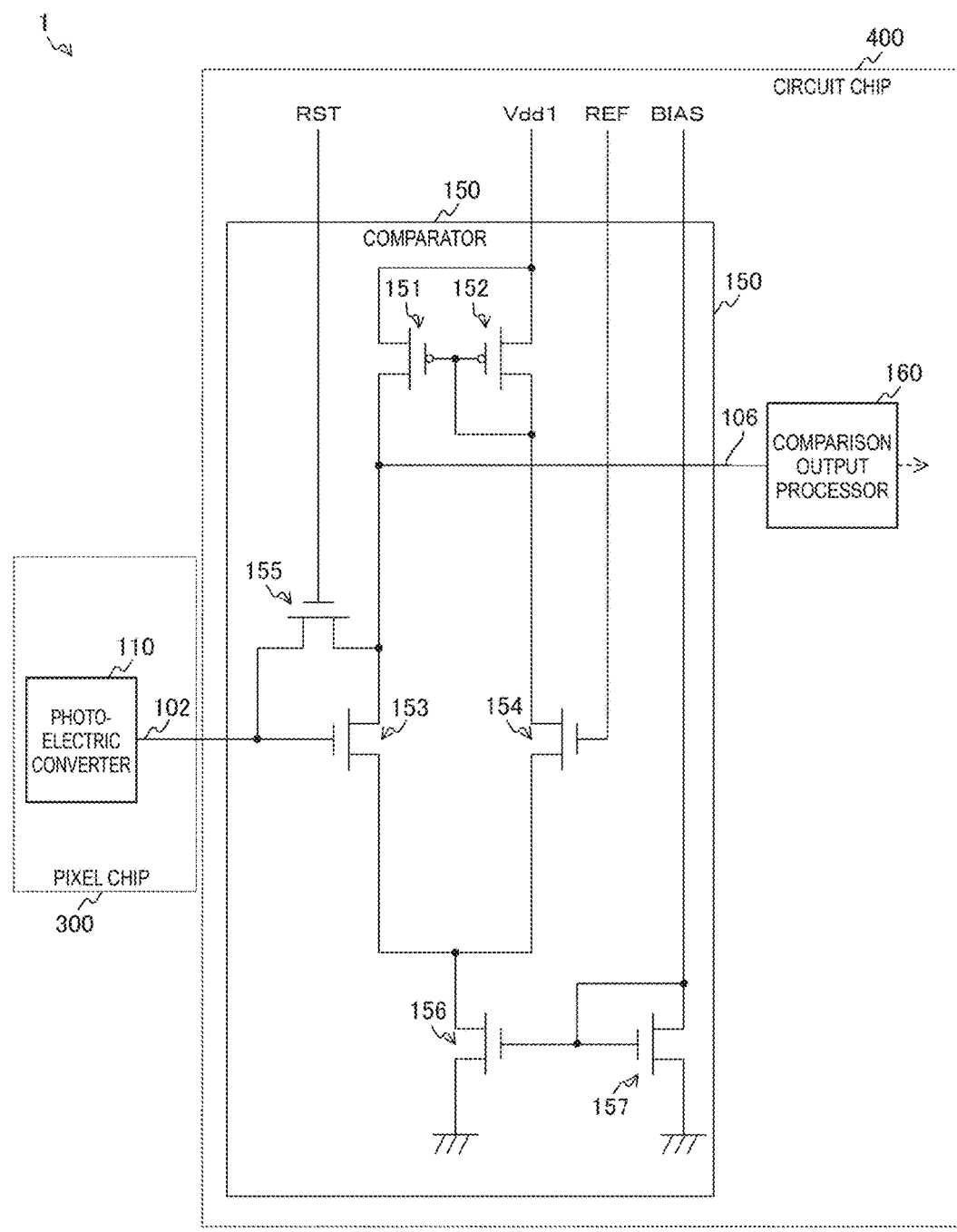
FIG. 11 is a diagram illustrating another configuration example of the semiconductor chip according to the first embodiment of the present technology.

FIG. 11 is a diagram illustrating another configuration example of the semiconductor chip according to the first embodiment of the present technology. The drawing is an example given to make comparison with the configuration example described in FIG. 10. The photoelectric converter 110 is disposed in the pixel chip 300 in the drawing. That is, in the example of the drawing, the pixel chip 300 and the circuit chip 400 are separated in a portion of the signal line 102 between the output of the photoelectric converter 110 and the gate of the signal input transistor 153 of the comparator 150. Unlike the above-described example, a signal delivered by the signal line 102 is a signal before amplification is performed by the signal input transistor 153 and the reference input transistor 154. Therefore, the signal level and the amplitude are small and it is easy to receive the influence of the noise.

Also, since the two semiconductor chips are separated in the portion of the signal line 102, large stray capacitance is connected to the output of the photoelectric converter 110. As described above, the generated charge retainer 113 is connected to the signal line 102. For this reason, the large stray capacitance is connected to the generated charge retainer 113 in parallel, an error increases.

Further, since the two semiconductor chips are separated in the portion of the signal line 102, a wiring length of the signal line 102 with relatively high impedance increases and the mixing of the noise increases. Thus, in the example of the drawing, an influence of the noise is larger than in the example of FIG. 10.

[Configuration of Pixel Chip]

Figure 12:
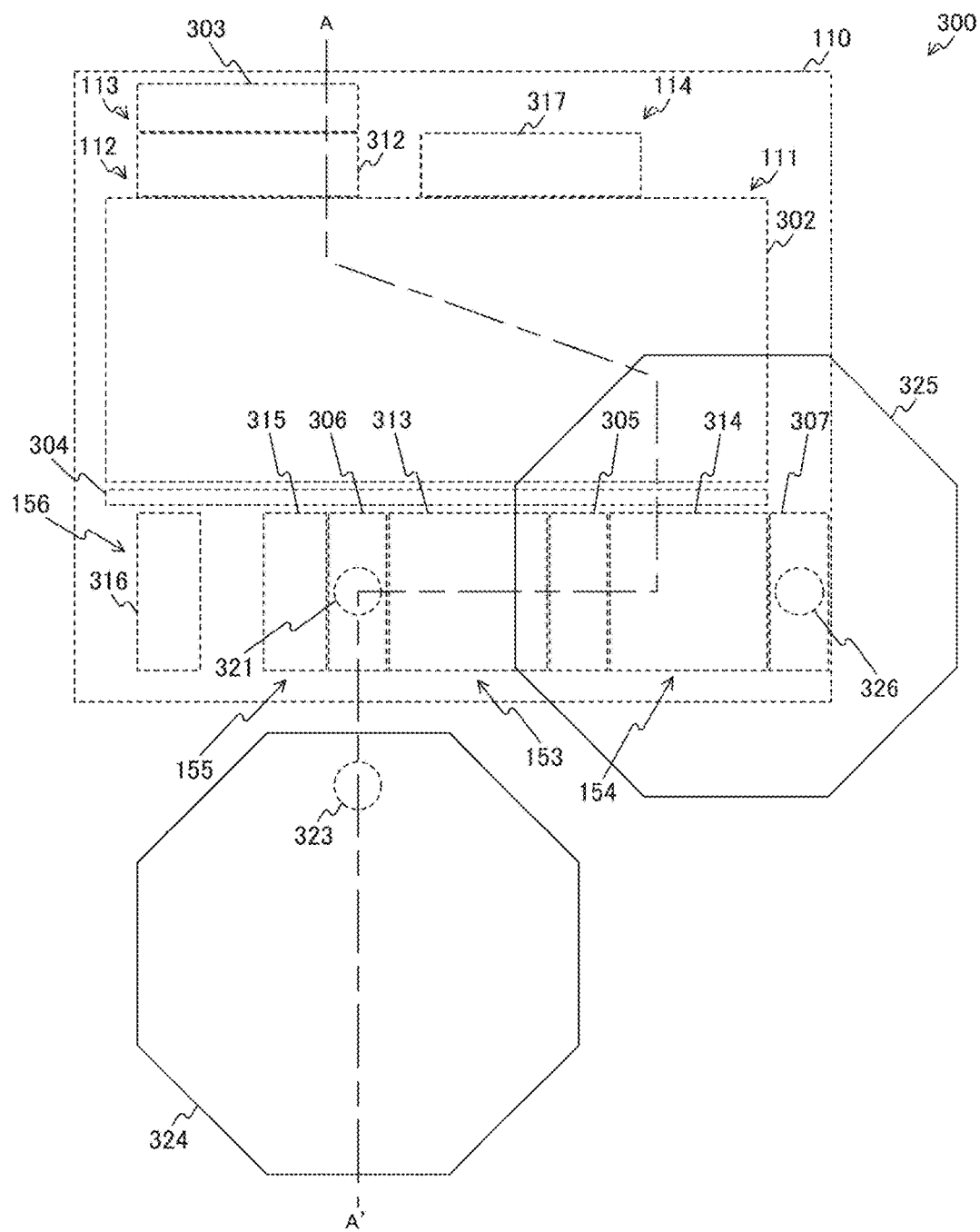
FIG. 12 is a diagram illustrating a configuration example of a pixel chip 300 according to the first embodiment of the present technology.

FIG. 12 is a diagram illustrating a configuration example of the pixel chip 300 according to the first embodiment of the present technology. The drawing is a schematic top view illustrating the vicinity of the photoelectric converter 110 in the pixel chip 300. In the drawing, portions illustrated by dotted lines indicate elements formed inside the pixel chip 300. The photoelectric conversion element 111 is disposed in the middle of the photoelectric converter 110 in the drawing. As will be described below, the photoelectric conversion element 111 is configured with an N-type semiconductor region 302. A gate 312 of a charge transmitter 112 and a gate 217 of the overflow gate 114 are disposed to be adjacent to the upper side of the photoelectric conversion element 111. Also, the generated charge retainer 113 is disposed to be adjacent to the upper side of the charge transmitter 112. The generated charge retainer 113 is configured with an N-type semiconductor region 303.

A separation region 304 is disposed on the lower side of the photoelectric conversion element 111. In the separation region 304, circuits included in the photoelectric conversion element 111 and the comparator 150 are separated. The separation region 304 can be formed of, for example, silicon dioxide (SiO$_2$). On the lower side of the separation region 304, the reference input transistor 154, the signal input transistor 153, and the MOS transistors 155 and 156 are disposed in order from the right side.

The reference input transistor 154 is configured to include a gate 314 and N-type semiconductor regions 307 and 305. The N-type semiconductor regions 307 and 305 are equivalent to drain and source regions, respectively. A via plug 326 is formed in the drain region (the N-type semiconductor region 307) of the reference input transistor. The via plug 326 is connected to a pad 325.

The signal input transistor 153 is configured to include a gate 313 and N-type semiconductor regions 306 and 305. The N-type semiconductor regions 306 and 305 are equivalent to drain and source regions, respectively. In this way, the N-type semiconductor region 305 is a common source region of the reference input transistor 154 and the signal input transistor 153. A via plug 321 is formed in the drain region (the N-type semiconductor region 306) of the signal input transistor.

As will be described below, the via plug 321 is connected to a pad 324 via a wiring layer 322 (not illustrated) and a via plug 323. In addition, the pad 324 is an example of a first pad described in the claims.

The drain region (the N-type semiconductor region 306) and the gate 315 of the MOS transistor 155 are disposed to be adjacent to the signal input transistor 153. The N-type semiconductor region 306 is a common drain region of the signal input transistor 153 and the MOS transistor 155. Also, a gate 316 of the MOS transistor 156 is disposed to be adjacent to the MOS transistor 155. The source region of the MOS transistor 155 and the drain and source regions of the MOS transistor 156 will not be described.

[Configuration of Circuit Chip]

Figure 13:
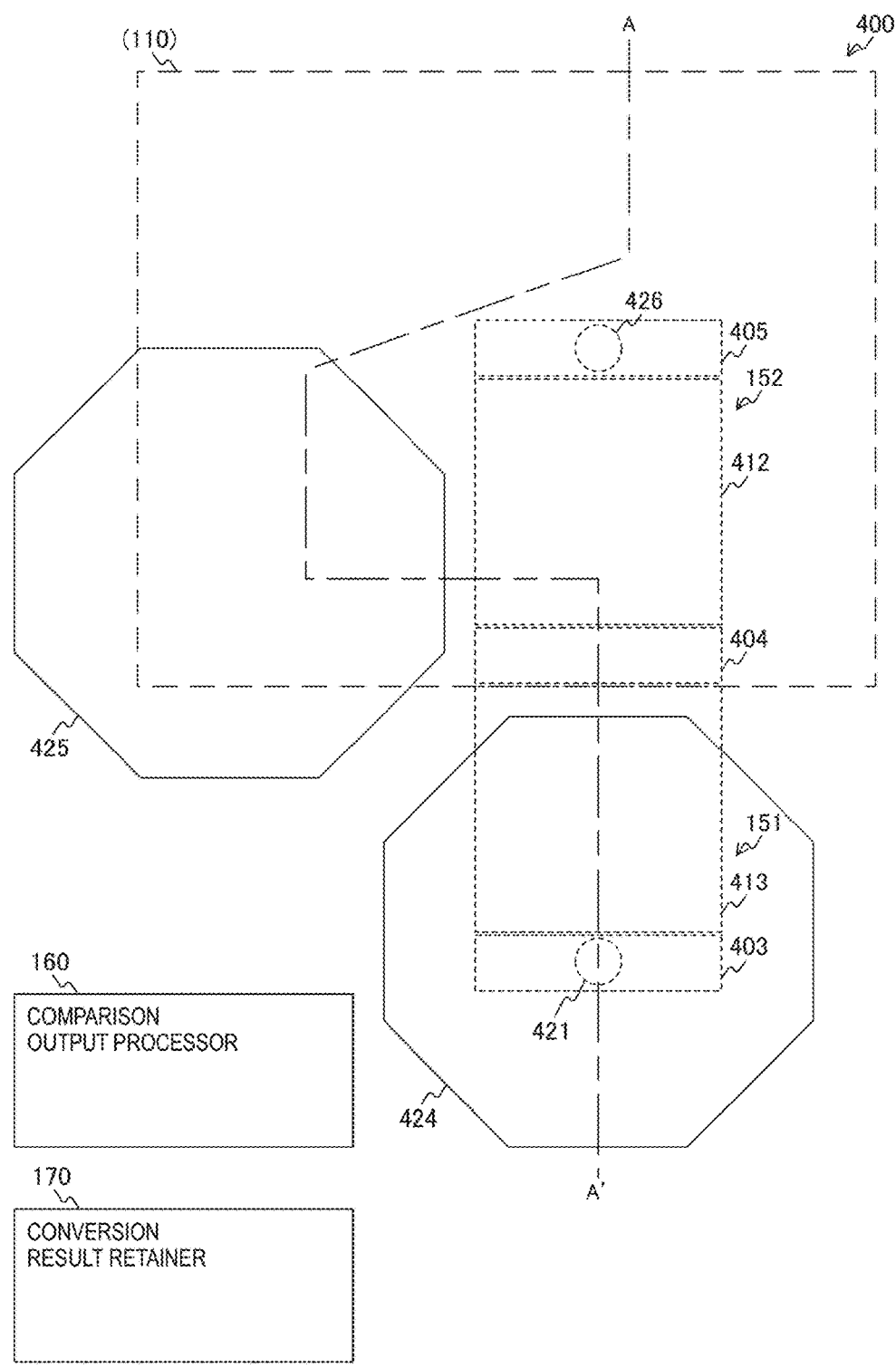
FIG. 13 is a diagram illustrating a configuration example of a circuit chip 400 according to the first embodiment of the present technology.

FIG. 13 is a diagram illustrating a configuration example of the circuit chip 400 according to the first embodiment of the present technology. The drawing is a schematic top view illustrating the vicinity of the photoelectric converter 110 in the circuit chip 400. In the drawing, portions illustrated by dotted lines indicate elements formed inside the circuit chip 400. Also, a portion (the photoelectric converter 110) illustrated by a dotted line is an element which is disposed in the pixel chip 300.

In the middle of the drawing, a gate 412 and P-type semiconductor regions 404 and 405 of the MOS transistor 152 are disposed. The P-type semiconductor regions 404 and 405 are equivalent to the source and drain regions of the MOS transistor 152, respectively. A via plug 426 is formed in the drain region (the P-type semiconductor region 405) of the MOS transistor 152. The via plug 426 is connected to a pad 425 via a wiring layer (not illustrated).

A gate 413 and a P-type semiconductor region 403 of the MOS transistor 151 are disposed to be adjacent to the lower side of the source region (the P-type semiconductor region 404) of the MOS transistor 152. The P-type semiconductor regions 403 and 404 are equivalent to the drain and source regions of the MOS transistor 151, respectively. In this way, the P-type semiconductor region 404 is a common source region of the MOS transistors 152 and 151. A via plug 421 is formed in the drain (the P-type semiconductor region 403) of the MOS transistor 151. The via plug 421 is connected to a pad 424 via a wiring layer 422 (not illustrated) and a via plug 423 (not illustrated) to be described below. In addition, the pad 424 is an example of a second pad described in the claims.

Also, in the circuit chip, the comparison output processor 160 and the conversion result retainer 170 are disposed for each photoelectric converter 110.

[Configuration of Cross-section of Semiconductor Chip]

Figure 14:
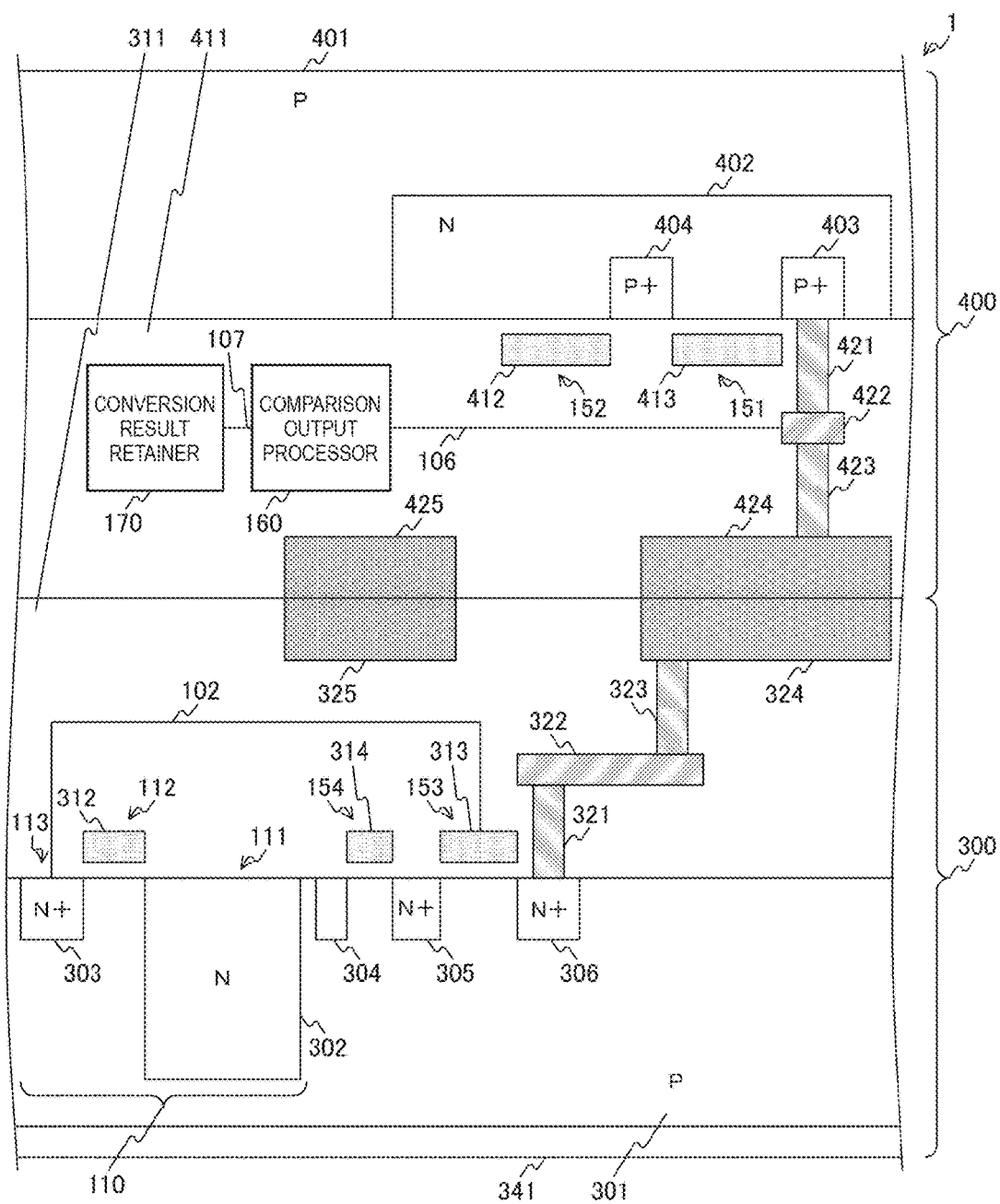
FIG. 14 is a schematic sectional view illustrating a configuration example of an imaging device 1 according to the first embodiment of the present technology.

FIG. 14 is a schematic sectional view illustrating a configuration example of the imaging device 1 according to the first embodiment of the present technology. The upper surfaces (surfaces on which the pad 324 and the like are disposed) of the pixel chip 300 described in FIG. 12 and the circuit chip 400 described in FIG. 13 are bonded to form the imaging device 1. At this time, the pads 324 and 424 and the pads 325 and 425 are aligned to be brought into contact with each other and are bonded. The drawing is a diagram schematically illustrating the cross section of the imaging device 1 after the bonding along the line A-A' in FIGS. 12 and 13.

The pixel chip 300 is disposed on the lower side of the drawing and the circuit chip 400 is disposed on the upper side of the drawing. Also, as illustrated in the drawing, the pads 324 and 424 and the pads 325 and 425 are bonded to be electrically connected to each other. Thus, signals are exchanged between the pixel chip 300 and the circuit chip 400.

The pixel chip 300 is a so-called backside irradiation type chip. A color filter 341 is disposed on the bottom of a P-type semiconductor substrate 301 and this surface is irradiated with light. In the pixel chip 300 in the drawing, the generated charge retainer 113, the charge transmitter 112, and the photoelectric conversion element 111 are illustrated as the photoelectric converter 110. The N-type semiconductor region 302 of the photoelectric conversion element 111 is formed in the P-type semiconductor substrate 301. In addition, photoelectric conversion is performed to generate a charge in a PN junction portion between the N-type semiconductor region and the peripheral P-type semiconductor region. Electrons of the charge are retained in the N-type semiconductor region 302. In addition, since a dark current is reduced, a thin P-type semiconductor region can also be formed above the N-type semiconductor region 302.

On the left side of the photoelectric conversion element 111, the gate 312 of the charge transmitter 112 and the N-type semiconductor region 303 of the generated charge retainer 113 are disposed in order. In addition, the gate 312 is formed inside an insulation layer 311 and can be formed of polysilicon. The charge transmitter 112 is an equivalence of the MOS transistor in which the N-type semiconductor regions 302 and 303 serve as a source and a drain, respectively. Also, the separation region 304 is disposed on the right side of the photoelectric converter 110.

On the right side of the separation region 304, the gate 314 of the reference input transistor 154, the N-type semiconductor region 305, and the gate 313 and the N-type semiconductor region 306 of the signal input transistor 153 are disposed in order. The N-type semiconductor region 303 of the generated charge retainer 113 and the gate 313 of the signal input transistor 153 are connected by the signal line 102.

The via plug 321 is formed in the N-type semiconductor region 306, the wiring layer 322 is formed above the via plug 321, and the via plug 323 is further formed in the wiring layer 322. The pad 324 is formed above the via plug 323. That is, the drain region (the N-type semiconductor region 306) of the signal input transistor 153 and the pad 324 are electrically connected by the via plugs 321 and 323 and the wiring layer 322. The via plugs 321 and 323 and the wiring layer 322 can be formed of metal. In addition, the via plugs 321 and 323 and the wiring layer 322 are an example of a first signal line described in the claims.

In the circuit chip 400 in the drawing, the MOS transistors 151 and 152, the comparison output processor 160, and the conversion result retainer 170 are illustrated. An N-type well region 402 is formed in the P-type semiconductor substrate 401 and the P-type semiconductor region 403 of the MOS transistor 151 is disposed in the well region 402. The P-type semiconductor region 403 is equivalent to the drain of the MOS transistor 151. Also, the gate 413 of the MOS transistor 151 is disposed inside an insulation layer 411. The P-type semiconductor region 404 and the gate 412 of the MOS transistor 152 are disposed in order to be adjacent to the gate 413. As described above, the P-type semiconductor region 404 is equivalent to a common source region of the MOS transistors 151 and 152.

The via plug 421 is formed in the drain region (the P-type semiconductor region 403) of the MOS transistor 151, the wiring layer 422 is formed above the via plug 421 (in a lower portion in the drawing), and the via plug 423 is further formed in the wiring layer 422. The pad 424 is disposed above the via plug 423 (in a lower portion in the drawing). That is, the drain region (the P-type semiconductor region 403) of the MOS transistor 151 and the pad 424 are electrically connected by the via plugs 421 and 423 and the wiring layer 422. The via plugs 421 and 423 and the wiring layer 422 can be formed of metal. In addition, the via plugs 421 and 423 and the wiring layer 422 are an example of a second signal line described in the claims.

As described above, the pads 324 and 424 are electrically connected to each other. Therefore, the drain region of the signal input transistor 153 and the drain region of the MOS transistor 151 are electrically connected by the pads 324 and 424, the wiring layers 322 and 422, and the via plugs 321, 323, 421, and 423. In addition, the wiring layer 422 and the input of the comparison output processor 160 are connected by the signal line 106. Also, the output of the comparison output processor 160 and the conversion result retainer 170 are connected by the signal line 107.

In addition, the configuration of the imaging device 1 is not limited to this example. For example, a configuration in which multiple wiring layers equal to or greater than two layers are formed can also be adopted.

[Process of Manufacturing Imaging Device]

Figure 15:
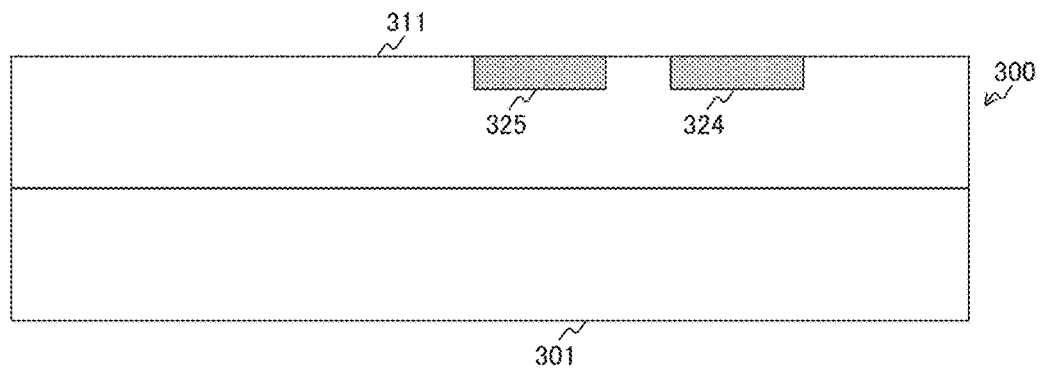
FIG. 15 is a diagram illustrating an example of a process of manufacturing the imaging device 1 according to the first embodiment of the present technology.
Figure 15:
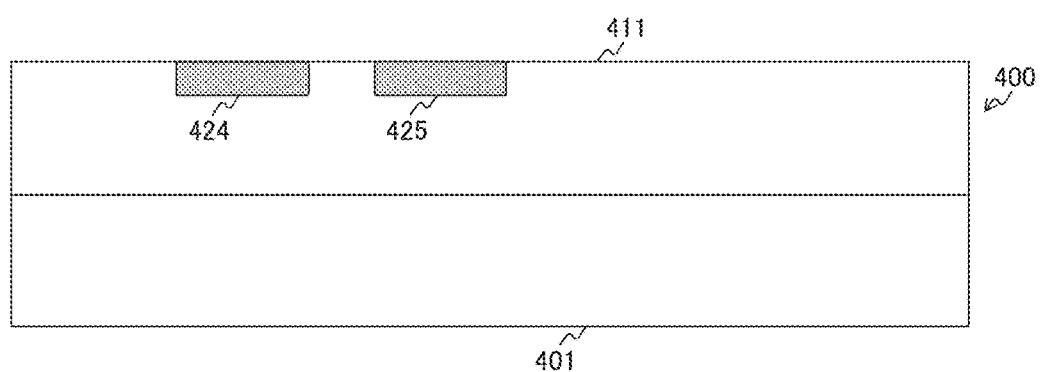
Figure 15:
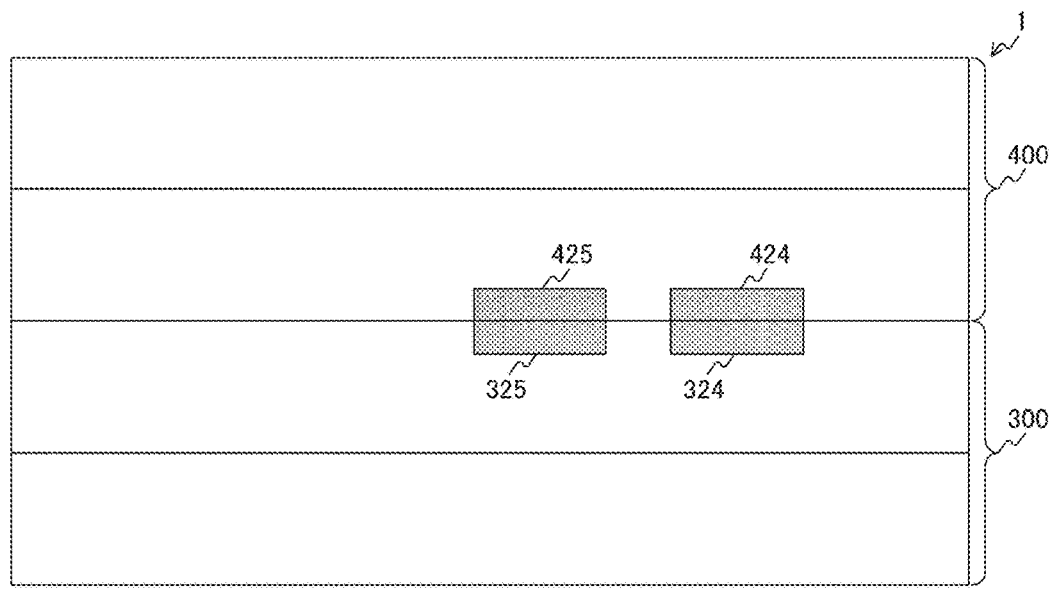

FIG. 15 is a diagram illustrating an example of a process of manufacturing the imaging device 1 according to the first embodiment of the present technology. The imaging device 1 can be manufactured in accordance with the following processes. First, the pixel chip 300 is formed. In the drawing, a indicates a process of forming the pixel chip 300. The N-type semiconductor region 303 and the like are formed on the surface of the P-type semiconductor substrate 301 by ion implantation and the insulation layer 311, the wiring layer 322, and the like are further formed. The layers can be formed by a chemical vapor deposition (CVD) method or the like. On the surface of the pixel chip 300, it is necessary for the pads 324 and 325 to be buried with the insulation layer 311. Further, to adhere to the circuit chip 400, it is necessary to flatten the surface of the pixel chip 300. Therefore, for example, polishing can be performed on the surface of the pixel chip 300 in accordance with, for example, a chemical mechanical polishing (CMP) method.

Subsequently, the circuit chip 400 is formed. In the drawing, b indicates a process of forming the circuit chip 400. The N-type well region 402 and the like are formed on the surface of the P-type semiconductor substrate 401 and the insulation layer 411, the wiring layer 422, and the like are further formed. The surface of the circuit chip 400 can be polished as in the pixel chip 300.

Subsequently, the pixel chip 300 and the circuit chip 400 are bonded. In the drawing, c indicates the bonding process. At this time, the pads 324 and 325 and the pads 424 and 425 are aligned be brought into contact with each other so that the surfaces of the pixel chip 300 and the circuit chip 400 are brought into contact with each other. Thereafter, the semiconductor chips are bonded by performing thermal pressing on the pads. A thermal temperature can be set to be, for example, 300° C. to 600° C.

After the thermal pressing, color filters or microlenses are formed. Through the processes, the imaging device 1 can be manufactured.

In this way, in the first embodiment of the present technology, the imaging device is configured by bonding the pixel chip 300 and the circuit chip 400. At this time, by disposing the signal input transistor and the reference input transistor in the comparator included in the analog-digital converter in the pixel chip 300, the result of the comparison between the input signal and the reference signal is delivered from the pixel chip 300 to the circuit chip 400 to be processed. Thus, it is possible to reduce the influence of noise.

<2.Second Embodiment>

In the above-described first embodiment, the signal input transistor 153, the reference input transistor 154, and the MOS transistor 156 of the comparator 150 are disposed in the pixel chip 300. In a second embodiment of the present technology, however, the MOS transistor 156 is disposed in the circuit chip 400. Thus, it is possible to simplify the configuration of the pixel chip 300.

[Configuration of Semiconductor Chip]

Figure 16:
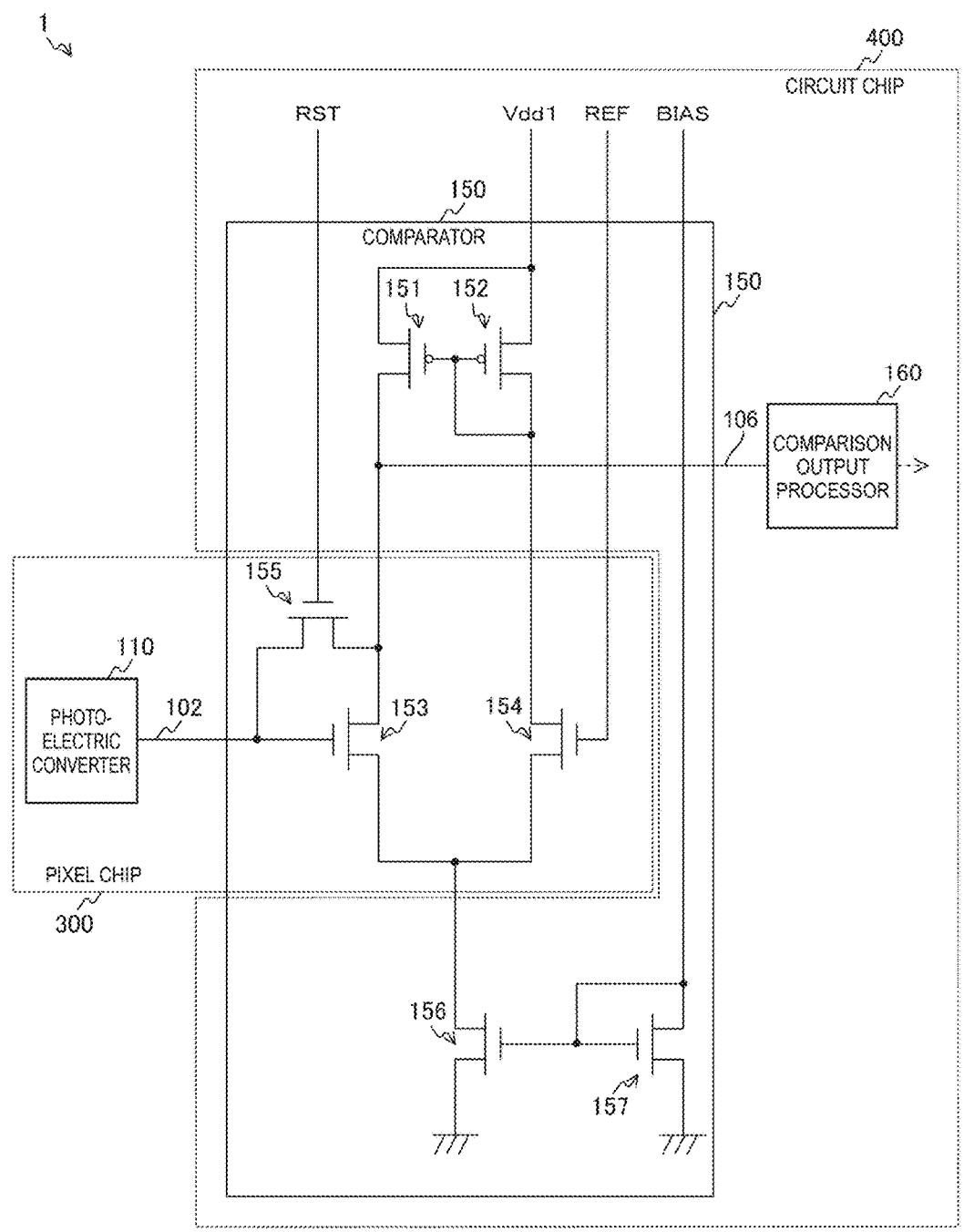
FIG. 16 is a diagram illustrating a configuration example of a semiconductor chip according to a second embodiment of the present technology.

FIG. 16 is a diagram illustrating a configuration example of a semiconductor chip according to the second embodiment of the present technology. The imaging device 1 in the drawing is different from the imaging device 1 described in FIG. 10 in that the MOS transistor 156 is disposed in the circuit chip 400.

The MOS transistor 156 operates as a constant-current power supply that restricts a current flowing in the signal input transistor 153 and the reference input transistor 154. Therefore, a relatively large current flows in the drain of the MOS transistor 156, and thus an influence of noise is rarely received. Also, since a large current flows, the size of the MOS transistor 156 is relatively large. Therefore, by disposing the MOS transistor 156 in the circuit chip 400, it is possible to simplify the configuration of the pixel chip 300.

Since the other remaining configuration of the imaging device 1 is the same as the configuration of the imaging device 1 described in the first embodiment of the present technology, the description thereof will be omitted.

In this way, according to the second embodiment of the present technology, by disposing the MOS transistor 156 in the circuit chip 400, it is possible to simplify the configuration of the pixel chip 300.

<3.Third Embodiment>

In the above-described first embodiment, the signal input transistor 153, the reference input transistor 154, and the MOS transistor 156 of the comparator 150 are disposed in the pixel chip 300. In a third embodiment of the present technology, however, the MOS transistors 151 and 152 are further disposed in the pixel chip 300. Thus, it is possible to improve characteristics of the comparator 150.

[Configuration of Semiconductor Chip]

Figure 17:
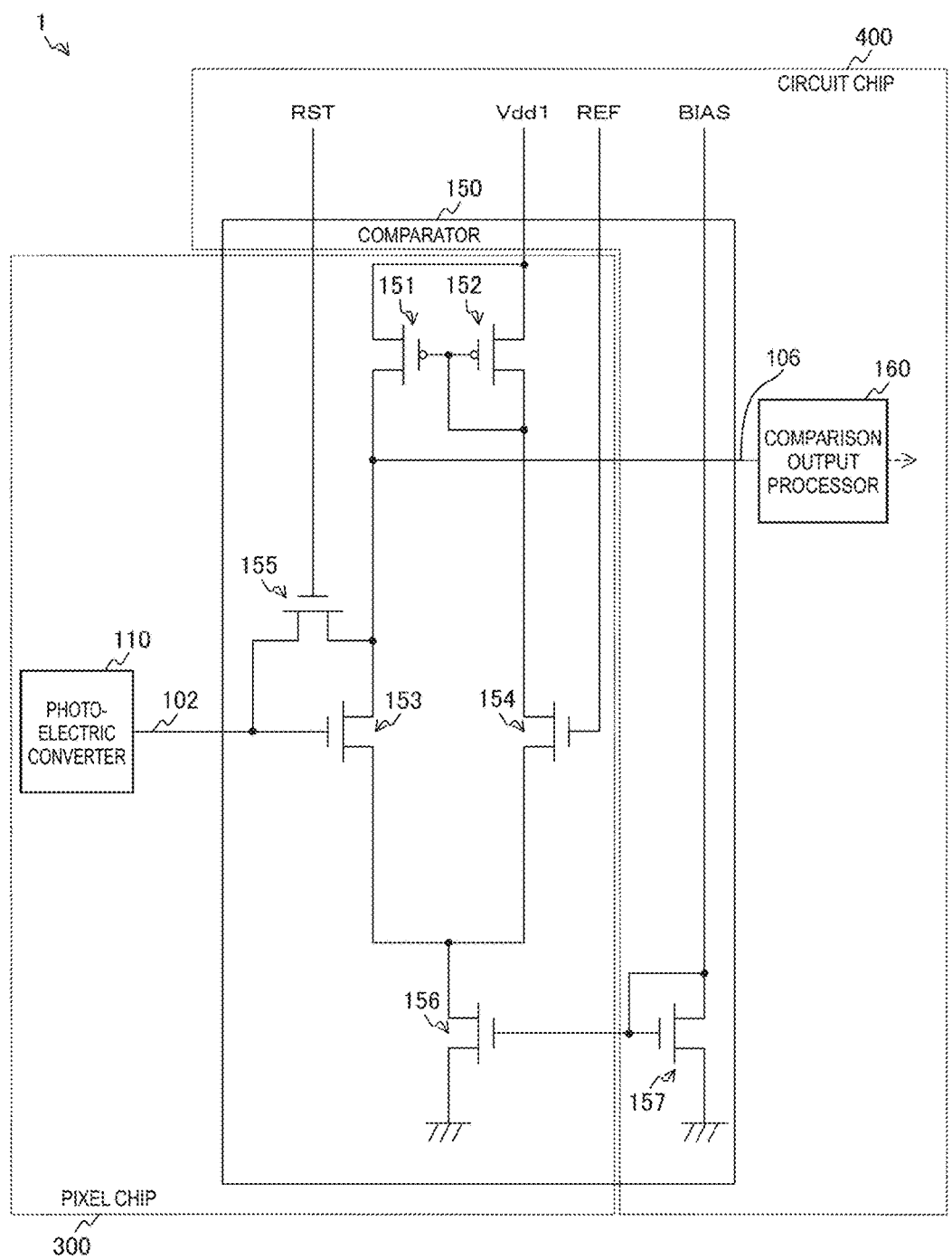
FIG. 17 is a diagram illustrating a configuration example of a semiconductor chip according to a third embodiment of the present technology.

FIG. 17 is a diagram illustrating a configuration example of a semiconductor chip according to the third embodiment of the present technology. The imaging device 1 in the drawing is different from the imaging device 1 described in FIG. 10 in that the MOS transistors 151 and 152 are disposed in the pixel chip 300.

The MOS transistors 151 and 152 are MOS transistors that operate as loads of the signal input transistor 153 and the reference input transistor 154, respectively. Therefore, a change in a current flowing in the drain of the signal input transistor 153 is converted into a change in a voltage and the change in the voltage is delivered as a result of comparison between the input signal and the reference signal from the pixel chip 300 to the circuit chip 400 via the signal line 106. Even in this case, since a signal with a relatively large level is delivered, it is possible to realize the comparator 150 which rarely receives an influence of noise.

Also, for the comparator 150 in the drawing, the MOS transistors 151 and 152 forming a differential amplifier, the signal input transistor 153, the reference input transistor 154, and the MOS transistor 156 are disposed in the same semiconductor chip (the pixel chip 300). Therefore, in the MOS transistors, characteristics originating from a process at the time of manufacturing, a temperature at the time of an operation, and the like are substantially the same, and thus offset or drift can be decreased.

Since the other remaining configuration of the imaging device 1 is the same as the configuration of the imaging device 1 described in the first embodiment of the present technology, the description thereof will be omitted.

In this way, according to the third embodiment of the present technology, by disposing the MOS transistors 151 and 152 in the pixel chip 300, it is possible to improve characteristics such as offset in the comparator 150.

<4.Fourth Embodiment<

In the above-described first embodiment, the signal input transistor 153, the reference input transistor 154, and the MOS transistor 156 of the comparator 150 are disposed in the pixel chip 300. In a fourth embodiment of the present technology, however, the MOS transistor 157 is further disposed in the pixel chip 300. Thus, it is possible to reduce a variation in a gain of the comparator 150.

[Configuration of Semiconductor Chip]

Figure 18:
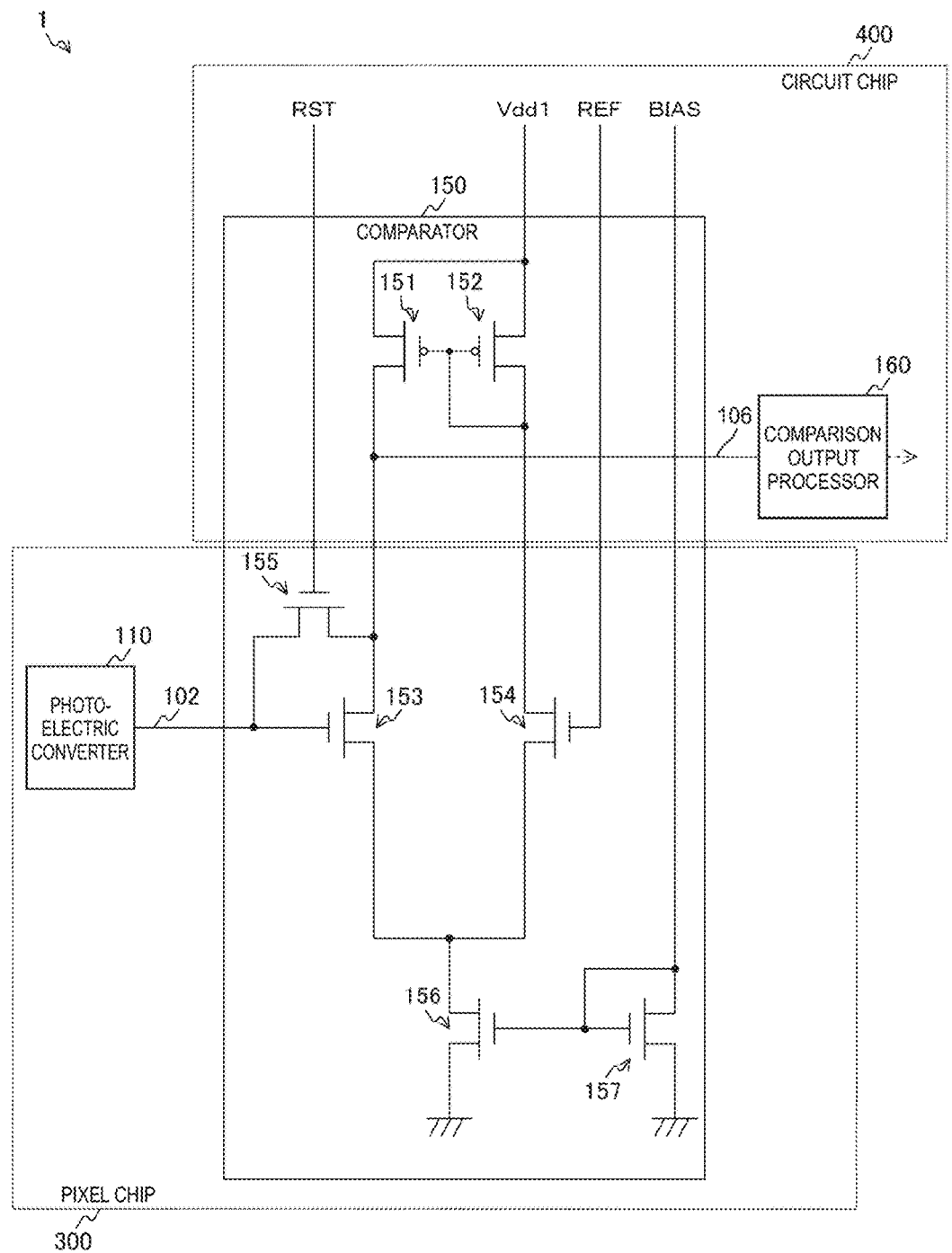
FIG. 18 is a diagram illustrating a configuration example of a semiconductor chip according to a fourth embodiment of the present technology.

FIG. 18 is a diagram illustrating a configuration example of a semiconductor chip according to the fourth embodiment of the present technology. The imaging device 1 in the drawing is different from the imaging device 1 described in FIG. 10 in that the MOS transistor 157 is disposed in the pixel chip 300.

The MOS transistors 156 and 157 form a current mirror circuit. In the fourth embodiment of the present technology, the MOS transistors 156 and 157 are disposed in the same semiconductor chip (the pixel chip 300). Therefore, in the MOS transistors 156 and 157, characteristics originating from a process at the time of manufacturing, a temperature at the time of an operation, and the like are substantially the same, and thus it is possible to reduce a variation in a current flowing in the MOS transistors. Thus, it is possible to reduce a gain of the differential pair (the signal input transistor 153 and the reference input transistor 154) or a variation in a drain current.

Since the other remaining configuration of the imaging device 1 is the same as the configuration of the imaging device 1 described in the first embodiment of the present technology, the description thereof will be omitted.

In this way, according to the fourth embodiment of the present technology, by disposing the MOS transistors 156 and 157 in the pixel chip 300, it is possible to reduce the variation in the gain or the like of the comparator 150.

<5.Fifth Embodiment>

In the above-described first embodiment, by disposing the signal input transistor 153 and the reference input transistor 154 of the comparator 150 in the same semiconductor chip, it is possible to improve performance of the comparator 150. In a fifth embodiment of the present technology, however, orientations of currents flowing in the MOS transistors are aligned. Thus, it is possible to improve characteristics such as offset in the comparator 150.

[Configuration of Semiconductor Chip]

Figure 19:
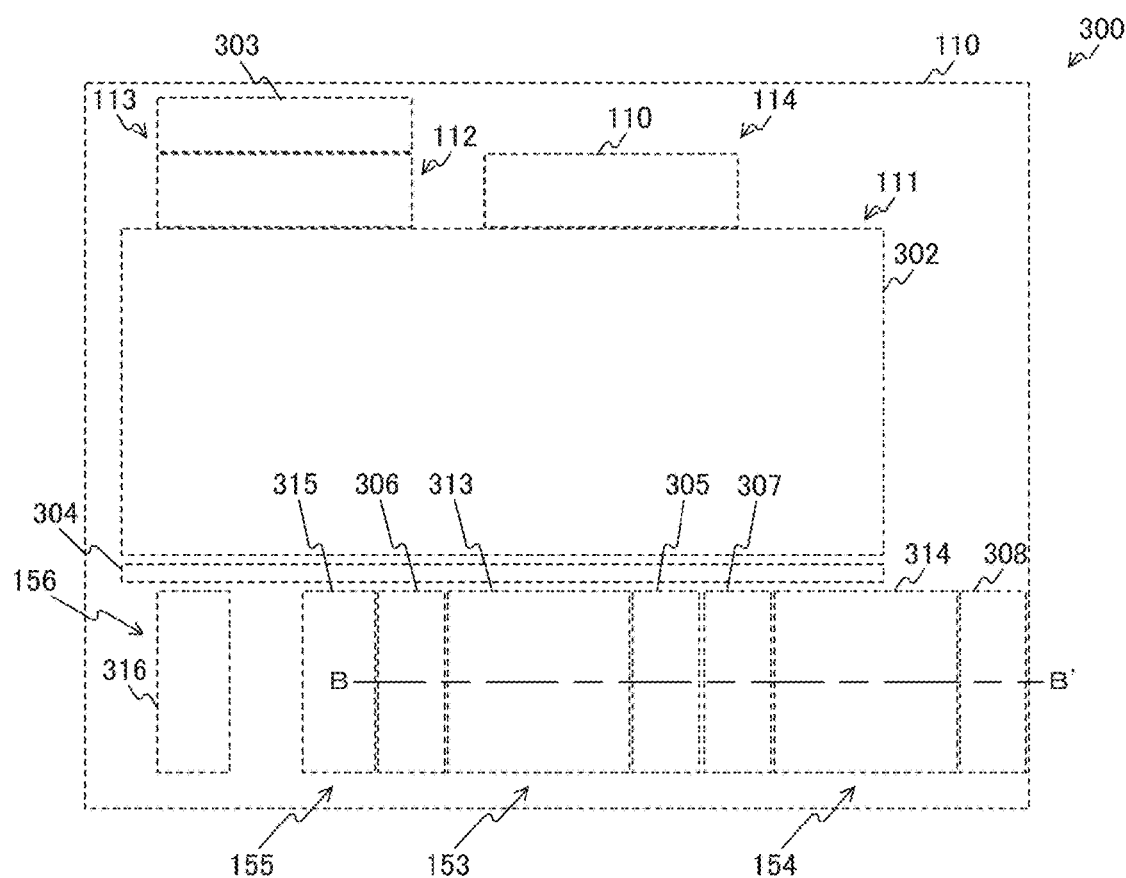
FIG. 19 is a diagram illustrating a configuration example of a pixel chip 300 according to a fifth embodiment of the present technology.

FIG. 19 is a diagram illustrating a configuration example of a pixel chip 300 according to the fifth embodiment of the present technology. The pixel chip 300 in the drawing is different from the pixel chip 300 described in FIG. 12 in the following points. First, the reference input transistor 154 includes an N-type semiconductor region 308 as a source region. Thus, the signal input transistor 153 and the reference input transistor 154 individually have source regions. Further, the drain and the source region of the reference input transistor 154 are disposed to be replaceable.

Thus, it is possible to align the orientations of the currents flowing in the channels of the signal input transistor 153 and the reference input transistor 154.

[Configuration of Semiconductor Chip]

Figure 20:
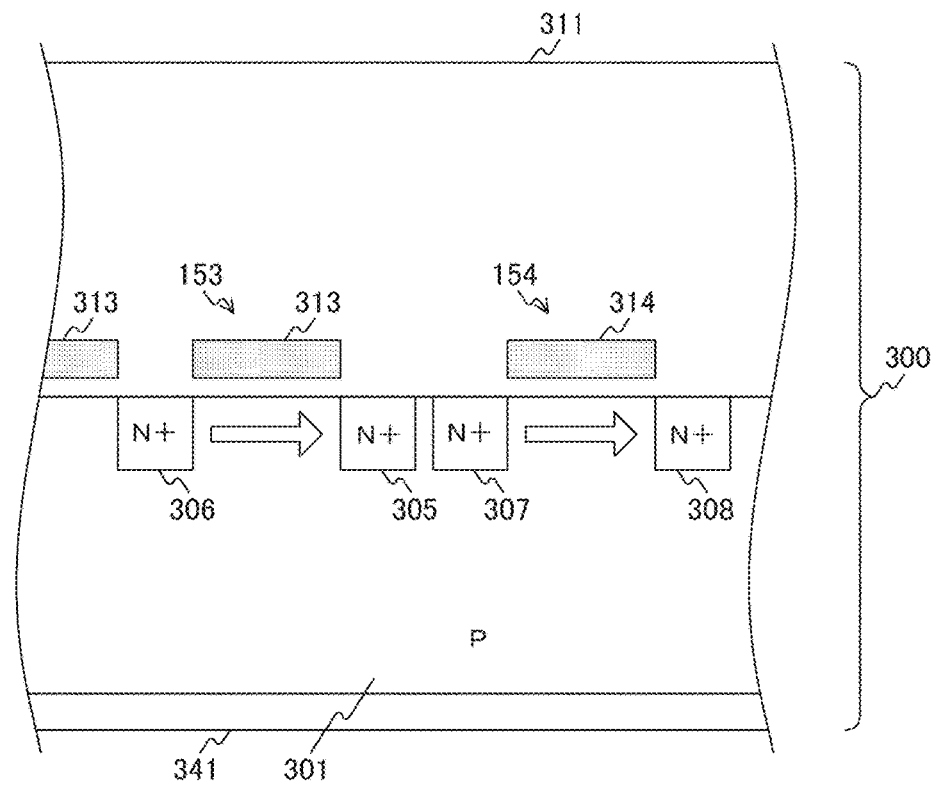
FIG. 20 is a schematic sectional view illustrating a configuration example of the pixel chip 300 according to the fifth embodiment of the present technology.
Figure 20:
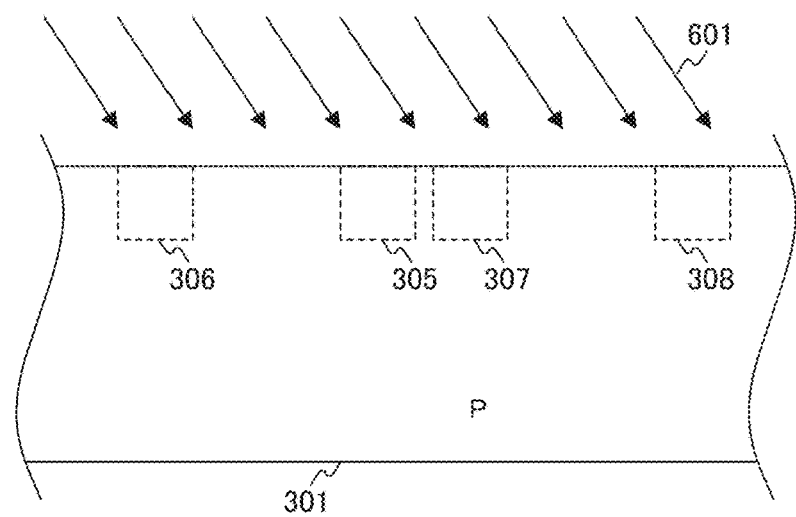

FIG. 20 is a schematic sectional view illustrating a configuration example of the pixel chip 300 according to the fifth embodiment of the present technology. In the drawing, a is a diagram schematically the cross-section of the pixel chip 300 taken along the line B-B' in FIG. 19. Also, an arrow illustrated in a of the drawing indicates an orientation of a current flowing in channel regions of the signal input transistor 153 and the reference input transistor 154.

To improve the performance of the comparator 150, it is necessary to align the characteristics of the signal input transistor 153 and the reference input transistor 154 that form the differential pair. The N-type semiconductor regions 306 and 305 illustrated in a of the drawing are equivalent to the drain and source regions of the signal input transistor 153, respectively. Also, the N-type semiconductor regions 307 and 308 are equivalent to the drain and source regions of the reference input transistor 154, respectively. Therefore, the orientations of currents flowing in the channel regions of the transistors become equal.

In b of the drawing, a process of forming portions serving as the channel regions of the fifth input transistor 153 and the reference input transistor 154 by performing ion implantation on the P-type semiconductor substrate 301 in a process of manufacturing the pixel chip 300 is illustrated. An arrow 601 in b of the drawing indicates a direction of the ion implantation. In this way, by performing the ion implantation obliquely, it is possible to adjust a depth of the ion implantation and it is possible to precisely adjust a threshold of the MOS transistors. Thereafter, the N-type semiconductor region 306 and the like are formed in the P-type semiconductor substrate 301.

However, since the ion implantation is performed obliquely, a crystal defect in association with the ion implantation also occurs in an oblique direction in the P-type semiconductor substrate 301 in b of the drawing. Then, electric characteristics change in an opposite direction to a direction along in a direction of the crystal defect. Therefore, in a case in which the ion implantation is performed in an oblique direction, the characteristics of the MOS transistors can be set to be substantially the same by aligning the directions in which the currents flowing in the channel regions of the signal input transistor 153 and the reference input transistor 154. Thus, it is possible to decrease offset or drift.

Since the other remaining configuration of the imaging device 1 is the same as the configuration of the imaging device 1 described in the first embodiment of the present technology, the description thereof will be omitted.

In this way, according to the fifth embodiment of the present technology, the characteristics of the MOS transistors can be set to be substantially the same by aligning the orientations of the currents flowing in the signal input transistor 153 and the reference input transistor 154. Thus, the characteristics of the signal input transistor 153 and the reference input transistor 154 are substantially the same, and thus it is possible to improve characteristics such as offset in the comparator 150.

<6.Sixth Embodiment>

In the above-described fifth embodiment, by aligning orientations of currents flowing in the signal input transistor 153 and the reference input transistor 154 of the comparator 150, it is possible to achieve the improvement in the performance of the comparator 150. In a sixth embodiment of the preset technology, however, layouts in the circumference of the MOS transistors are set to be equal. Thus, it is possible to improve characteristics such as offset in the comparator 150.

[Configuration of Semiconductor Chip]

Figure 21:
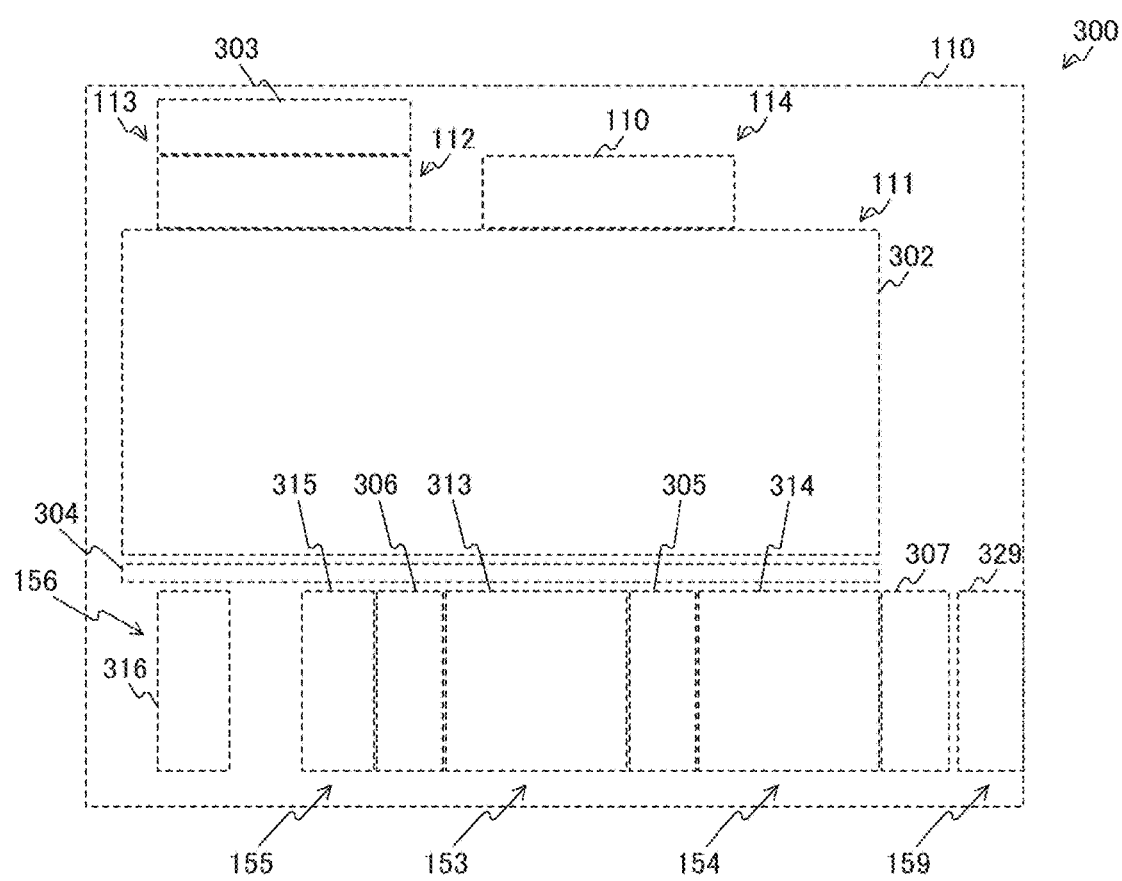
FIG. 21 is a diagram illustrating a configuration example of a pixel chip 300 according to a sixth embodiment of the present technology.

FIG. 21 is a schematic sectional view illustrating a configuration example of the pixel chip 300 according to the sixth embodiment of the present technology. The pixel chip 300 in the drawing is different from the pixel chip 300 described in FIG. 12 in that a MOS transistor 159 is included. The MOS transistor 159 includes a gate 329 and is disposed to be adjacent to the reference input transistor 154. The MOS transistor 159 is a so-called dummy transistor and is not a transistor used as a circuit component of the comparator 150.

The signal input transistor 153 in the drawing is disposed between the MOS transistor 155 and the reference input transistor 154. Accordingly, by disposing the MOS transistor 159, the reference input transistor 154 can be configured to be similarly disposed between two MOS transistors. Thus, the layouts in the circumference of the signal input transistor 153 and the reference input transistor 154 can be set to be equal, and thus the characteristics of the transistors can be set to be substantially the same.

Since the other remaining configuration of the imaging device 1 is the same as the configuration of the imaging device 1 described in the first embodiment of the present technology, the description thereof will be omitted.

In this way, in the sixth embodiment of the present technology, the layouts in the circumference of the signal input transistor 153 and the reference input transistor 154 can be set to be the same. Thus, the characteristics of the MOS transistors can be set to be substantially equal, and thus it is possible to improve the characteristics such as offset in the comparator 150.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a hard disk, a CD (Compact Disc), an MD (Mini-Disc), and a DVD (Digital Versatile Disk), a memory card, and a Blu-ray disc (registered trademark) can be used.

In addition, the effects described in the present specification are not limiting but are merely examples, and there may be other effects.

Additionally, the present technology may also be configured as below.

(1)
An imaging device including:
a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line; and
a second semiconductor chip configured to include a processing circuit which processes the result of the comparison, a second signal line which is electrically connected to the processing circuit and delivers the result of the comparison to the processing circuit, and a second pad which is electrically connected to the second signal line and the first pad.

(2)
The imaging device according to (1),
in which the first and second pads are electrically connected by thermal pressing.

(3)
The imaging device according to (1) or (2),
in which the first semiconductor chip further includes a constant-current power supply which controls currents flowing in the signal input transistor and the reference input transistor.

(4)
The imaging device according to any of (1) to (3),
in which the first semiconductor chip further includes a load portion which converts the change in the current into a change in a voltage, and
the first signal line delivers the change in the voltage as the result of the comparison.

(5)
The imaging device according to any of (1) to (4),
in which the processing circuit performs a process of retaining a digital signal corresponding to the reference signal on the basis of the output result of the comparison, and outputting the retained digital signal as a result of analog-digital conversion performed on the input signal.

(6)
The imaging device according to any of (1) to (5),
in which the first semiconductor chip further includes a photoelectric converter which generates the input signal, and
in the signal input transistor, the generated input signal is input to the control terminal.

(7)
A method of manufacturing an imaging device, the method including:
a step of forming a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line;
a step of forming a second semiconductor chip configured to include a processing circuit which processes the result of the comparison, a second signal line which is electrically connected to the processing circuit and delivers the result of the comparison to the processing circuit, and a second pad which is electrically connected to the second signal line; and
a step of bonding the first semiconductor chip and the second semiconductor chip in a state in which the first pad and the second pad come into contact with each other.

REFERENCE SIGNS LIST 1 imaging device
10 pixel array unit
20 time code generation unit
30 reference signal generation unit
40 vertical driving unit
50 horizontal control unit
52 time code decoding unit
53 column signal processing unit
54 clock signal generation unit
100 pixel
110 photoelectric converter
111 photoelectric conversion element
112 charge transmitter 113 generated charge retainer
114 overflow gate
150 comparator
151, 152, 155 to 157, 159, 511 to 517 MOS transistor
153 signal input transistor
154 reference input transistor
160 comparison output processor
161 preamplifier
162 level converter
163 waveform shaper
170 conversion result retainer
171 storage controller
172 storage portion
190 analog-digital converter
200 time code transmission unit
210 code retainer
211 flip-flop
220, 240 clock buffer
221 to 224 inversion gate
230 code retainer
300 pixel chip
321, 323, 326, 421, 426 via plug
322, 422 wiring layer
324, 325, 424, 425 pad
400 circuit chip
521 OR gate
522 bit storage portion
523 bidirectional switch

The invention claimed is:

1. An imaging device comprising:
a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line, wherein the first semiconductor chip includes a transfer gate and an overflow gate disposed in a first row, the signal input transistor and the reference input transistor are disposed in a second row, and a photodiode located between the first row and the second row; and
a second semiconductor chip configured to include a processing circuit which processes the result of the comparison, a second signal line which is electrically connected to the processing circuit and delivers the result of the comparison to the processing circuit, and a second pad which is electrically connected to the second signal line and the first pad.

2. The imaging device according to claim 1, wherein the first and second pads are electrically connected by thermal pressing.

3. The imaging device according to claim 1, wherein the first semiconductor chip further includes a constant-current power supply which controls currents flowing in the signal input transistor and the reference input transistor.

4. The imaging device according to claim 1, wherein the first semiconductor chip further includes a load portion which converts the change in the current into a change in a voltage, and the first signal line delivers the change in the voltage as the result of the comparison.

5. The imaging device according to claim 1, wherein the processing circuit performs a process of retaining a digital signal corresponding to the reference signal on the basis of the output result of the comparison, and outputting the retained digital signal as a result of analog-digital conversion performed on the input signal.

6. The imaging device according to claim 1, wherein the first semiconductor chip further includes a photoelectric converter which generates the input signal, and in the signal input transistor, the generated input signal is input to the control terminal.

7. The imaging device according to claim 1, further comprising an isolation region disposed between the photodiode and the second row.

8. The imaging device according to claim 1, wherein the isolation region comprises silicon dioxide.

9. The imaging device according to claim 1, further comprising a first MOS transistor disposed in the second row.

10. The imaging device according to claim 9, further comprising a second MOS transistor disposed in the second row.

11. The imaging device according to claim 10, wherein the first MOS transistor is disposed between the second MOS transistor and the signal input transistor.

12. The imaging device according to claim 11, wherein the signal input transistor is disposed between the first MOS transistor and the reference input transistor.

13. The imaging device according to claim 12, wherein a drain region of the signal input transistor is connected to the first pad through a via plug.

14. The imaging device according to claim 13, wherein each of the signal input transistor and the reference input transistor is larger than each of the first MOS transistor and second MOS transistor in a plan view.

15. The imaging device according to claim 14, wherein the transfer gate faces the first MOS transistor on the second MOS transfer across the photodiode.

16. The imaging device according to claim 15, wherein the overflow gate faces the signal input transistor or the reference input transistor across the photodiode.

17. A method of manufacturing an imaging device, the method comprising:
a step of forming a first semiconductor chip configured to include a signal input transistor in which an input signal which is a signal corresponding to incident light is input to a control terminal, a reference input transistor which forms a differential pair along with the signal input transistor and in which a reference signal is input to a control terminal, a first signal line which delivers a change in a current flowing in one of the signal input transistor and the reference input transistor as a result of comparison between the input signal and the reference signal when the current is changed in accordance with a difference between the input signal and the reference signal, and a first pad which is electrically connected to the first signal line, wherein the first semiconductor chip includes a transfer gate and an overflow gate disposed in a first row, the signal input transistor and the reference input transistor are disposed in a second row, and a photodiode located between the first row and the second row; and a step of forming a second semiconductor chip configured to include a processing circuit which processes the result of the comparison, a second signal line which is electrically connected to the processing circuit and delivers the result of the comparison to the processing circuit, and a second pad which is electrically connected to the second signal line; and a step of bonding the first semiconductor chip and the second semiconductor chip in a state in which the first pad and the second pad come into contact with each other.

\* \* \* \* \*